United States Patent
Alhussien et al.

(10) Patent No.: US 10,290,358 B2
(45) Date of Patent: May 14, 2019

(54) INDEPENDENT READ THRESHOLD VOLTAGE TRACKING FOR MULTIPLE DEPENDENT READ THRESHOLD VOLTAGES USING SYNDROME WEIGHTS

(71) Applicant: Seagate Technology LLC, Cupertino, CA (US)

(72) Inventors: AbdelHakim S. Alhussien, San Jose, CA (US); Sundararajan Sankaranarayanan, Fremont, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 111 days.

(21) Appl. No.: 15/639,052

(22) Filed: Jun. 30, 2017

(65) Prior Publication Data
US 2018/0012663 A1 Jan. 11, 2018

Related U.S. Application Data

(63) Continuation-in-part of application No. 15/205,654, filed on Jul. 8, 2016.

(51) Int. Cl.
*G11C 16/26* (2006.01)
*G11C 29/52* (2006.01)
(Continued)

(52) U.S. Cl.
CPC .......... *G11C 16/26* (2013.01); *G06F 11/1012* (2013.01); *G06F 11/1068* (2013.01);
(Continued)

(58) Field of Classification Search
CPC ..... G11C 16/26; G11C 11/5642; G11C 16/28; G11C 29/52; G06F 11/1012;
(Continued)

(56) References Cited

U.S. PATENT DOCUMENTS 6,466,614 B1  10/2002  Smith
8,243,511 B2   8/2012  Katzpatapoutian et al.
(Continued)

OTHER PUBLICATIONS

Peleato et al., "Towards Minimizing Read Time for Nand Flash".

*Primary Examiner* — Kyle Vallecillo
(74) *Attorney, Agent, or Firm* — Ryan, Mason & Lewis, LLP

(57) ABSTRACT

Read threshold voltage tracking techniques are provided for multiple dependent read threshold voltages using syndrome weights. One method comprises reading codewords of multiple pages using different first read threshold voltages and a default second read threshold voltage; decoding read values for the multiple pages for the different first read threshold voltages and the default second read threshold voltage; aggregating a syndrome weight for each failed decoding attempt for the different first read threshold voltages; identifying a selected first read threshold voltage using a corresponding syndrome weight; reading codewords of the multiple pages using the selected first read threshold voltage and different second read threshold voltages; decoding read values for the selected first read threshold voltage and the different second read threshold voltages; aggregating the syndrome weight for the different second read threshold voltages; and identifying a selected second read threshold voltage using a corresponding syndrome weight.

20 Claims, 16 Drawing Sheets

(51) Int. Cl.
*G06F 11/10* (2006.01)
*H03M 13/11* (2006.01)
*G11C 11/56* (2006.01)
*G11C 16/28* (2006.01)
*H03M 13/37* (2006.01)
*H03M 13/00* (2006.01)

(52) U.S. Cl.
CPC .......... *G11C 11/5642* (2013.01); *G11C 16/28* (2013.01); *G11C 29/52* (2013.01); *H03M 13/1105* (2013.01); *H03M 13/1108* (2013.01); *H03M 13/1111* (2013.01); *H03M 13/3707* (2013.01); *H03M 13/3723* (2013.01); *H03M 13/612* (2013.01); *H03M 13/6325* (2013.01)

(58) Field of Classification Search
CPC .......... G06F 11/1068; H03M 13/1105; H03M 13/1108; H03M 13/1111; H03M 13/3707; H03M 13/3723; H03M 13/612; H03M 13/6325
See application file for complete search history.

(56) References Cited

U.S. PATENT DOCUMENTS

| | | | |
|---|---|---|---|
| 8,392,809 B1 | 3/2013 | Vamica et al. | |
| 8,607,124 B2 | 12/2013 | Weingarten | |
| 8,769,380 B1 | 7/2014 | Burd | |
| 9,037,946 B2 | 5/2015 | Jeon et al. | |
| 9,043,678 B2 | 5/2015 | Jeon et al. | |
| 9,059,738 B2 | 6/2015 | Chung et al. | |
| 9,209,835 B2 | 12/2015 | Alhussien et al. | |
| 9,236,099 B2 | 1/2016 | Alhussien et al. | |
| 9,263,138 B1 | 2/2016 | Wilson et al. | |
| 9,378,765 B2 | 6/2016 | Cai | |
| 9,396,792 B2 | 7/2016 | Wu et al. | |
| 9,431,130 B2 | 8/2016 | Sakurada | |
| 9,583,217 B2 | 2/2017 | Lin et al. | |
| 9,633,740 B1 | 4/2017 | Alhussien et al. | |
| 9,697,905 B2 | 7/2017 | Sharon et al. | |
| 9,728,263 B2 | 8/2017 | Sharon et al. | |
| 9,768,807 B2 | 9/2017 | Zhang | |
| 2011/0161775 A1 | 6/2011 | Weingarten | |
| 2011/0182119 A1 | 7/2011 | Strasser et al. | |
| 2012/0317460 A1 | 12/2012 | Chilappagari et al. | |
| 2013/0139035 A1 | 5/2013 | Zhong et al. | |
| 2013/0173985 A1 | 7/2013 | Chung et al. | |
| 2013/0343131 A1 | 12/2013 | Wu et al. | |
| 2014/0229131 A1 | 8/2014 | Cohen et al. | |
| 2014/0269052 A1 | 9/2014 | Dusija et al. | |
| 2014/0281750 A1 | 9/2014 | Jeon et al. | |
| 2014/0281772 A1 | 9/2014 | Jeon et al. | |
| 2014/0355340 A1 | 12/2014 | Sharon et al. | |
| 2015/0039842 A1 | 2/2015 | Fitzpatrick et al. | |
| 2015/0052387 A1 | 2/2015 | Kern et al. | |
| 2015/0085571 A1 | 3/2015 | Hu et al. | |
| 2015/0085573 A1* | 3/2015 | Sharon | G06F 11/1048 365/185.03 |
| 2015/0127883 A1 | 5/2015 | Chen et al. | |
| 2015/0149840 A1 | 5/2015 | Alhussien et al. | |
| 2015/0149855 A1 | 5/2015 | Alhuissien et al. | |
| 2015/0149871 A1* | 5/2015 | Chen | G06F 11/1068 714/773 |
| 2015/0162057 A1 | 6/2015 | Alhussien et al. | |
| 2015/0243363 A1 | 8/2015 | Wu et al. | |
| 2015/0287453 A1 | 10/2015 | Wu et al. | |
| 2016/0247576 A1 | 8/2016 | Park | |
| 2017/0068591 A1* | 3/2017 | Tate | G06F 11/1068 |
| 2017/0148510 A1* | 5/2017 | Bazarsky | G06F 11/1048 |
| 2017/0271031 A1* | 9/2017 | Sharon | G11C 29/42 |

* cited by examiner

INDEPENDENT READ THRESHOLD VOLTAGE TRACKING FOR MULTIPLE DEPENDENT READ THRESHOLD VOLTAGES USING SYNDROME WEIGHTS

CROSS-REFERENCE TO RELATED APPLICATIONS

The present application is a continuation-in-part of U.S. patent application Ser. No. 15/205,654, filed Jul. 8, 2016, entitled "Read Retry Operations with Estimation of Written Data Based on Syndrome Weights," incorporated by reference herein in its entirety.

FIELD

The field relates generally to solid state storage media and, more particularly, to adjustments of read threshold voltages for such solid state storage media.

BACKGROUND

Solid state storage devices use analog memory cells to store data. Each memory cell stores a storage value, such as an electrical voltage. The storage value represents the information stored in the memory cell. Many solid state storage devices distinguish between different binary values that a memory cell may store based on a read voltage level of the memory cell. The range of possible storage values for each memory cell is typically divided into threshold regions, with each region separated by a read threshold voltage and corresponding to one or more data bit values. Ideally, all of the memory cells in a given solid state storage device have identical read threshold voltages for the logical bit values stored. In practice, however, the read threshold voltages differ across the cells in probability distributions along the read threshold voltage axis (e.g., "read threshold voltage distributions") that are similar to a Gaussian distribution.

In addition, solid state storage devices can shift over time. For example, memory cell leakage, memory cell damage and other disturbances to memory cells can alter the read voltage levels of the memory cells. Thus, the read threshold voltages can shift over time. If the read voltage level of a memory cell shifts past a read threshold voltage, a data error occurs, as the value of the data read from the memory cell is different than the value of the data that was written to the memory cell.

A number of techniques have been proposed or suggested for adapting to the changes in the read threshold voltages to maintain a desired performance level. Existing adaptive tracking algorithms are designed to track variations in the solid state storage channel and consequently, to help maintain a set of updated channel parameters. The updated channel parameters are used, for example, to adjust read threshold voltages.

A need exists for improved techniques for adapting read threshold voltages.

SUMMARY

Independent read threshold voltage tracking techniques are provided for multiple dependent read threshold voltages using syndrome weights. In one embodiment, a method comprises reading one or more codewords of a plurality of pages using a plurality of different values of a first read threshold voltage and a default value of a second read threshold voltage, wherein the reading requires the first read threshold voltage and at least the second read threshold voltage to read a plurality of bits in the plurality of pages; applying read values obtained from the memory for the plurality of pages for the plurality of values of the first read threshold voltage and the default value of the second read threshold voltage to a decoder; aggregating a syndrome weight for each failed decoding attempt for the plurality of values of the first read threshold voltage; identifying a reading using one of the plurality of values of the first read threshold voltage having a substantially minimum syndrome weight as a substantially optimum value for the first read threshold voltage; reading the one or more codewords of the plurality of pages using the substantially optimum value of the first read threshold voltage and a plurality of different values of the second read threshold voltage; applying the read values obtained from the memory for the substantially optimum value of the first read threshold voltage and the plurality of values of the second read threshold voltage to the decoder; aggregating the syndrome weight for each failed decoding attempt for the plurality of values of the second read threshold voltage; and identifying a reading using one of the plurality of values of the second read threshold voltage having a substantially minimum syndrome weight as a substantially optimum value for the second read threshold voltage.

Other illustrative embodiments include, without limitation, apparatus, systems, controllers, methods and computer program products comprising processor-readable storage media.

DETAILED DESCRIPTION

Figure 1:
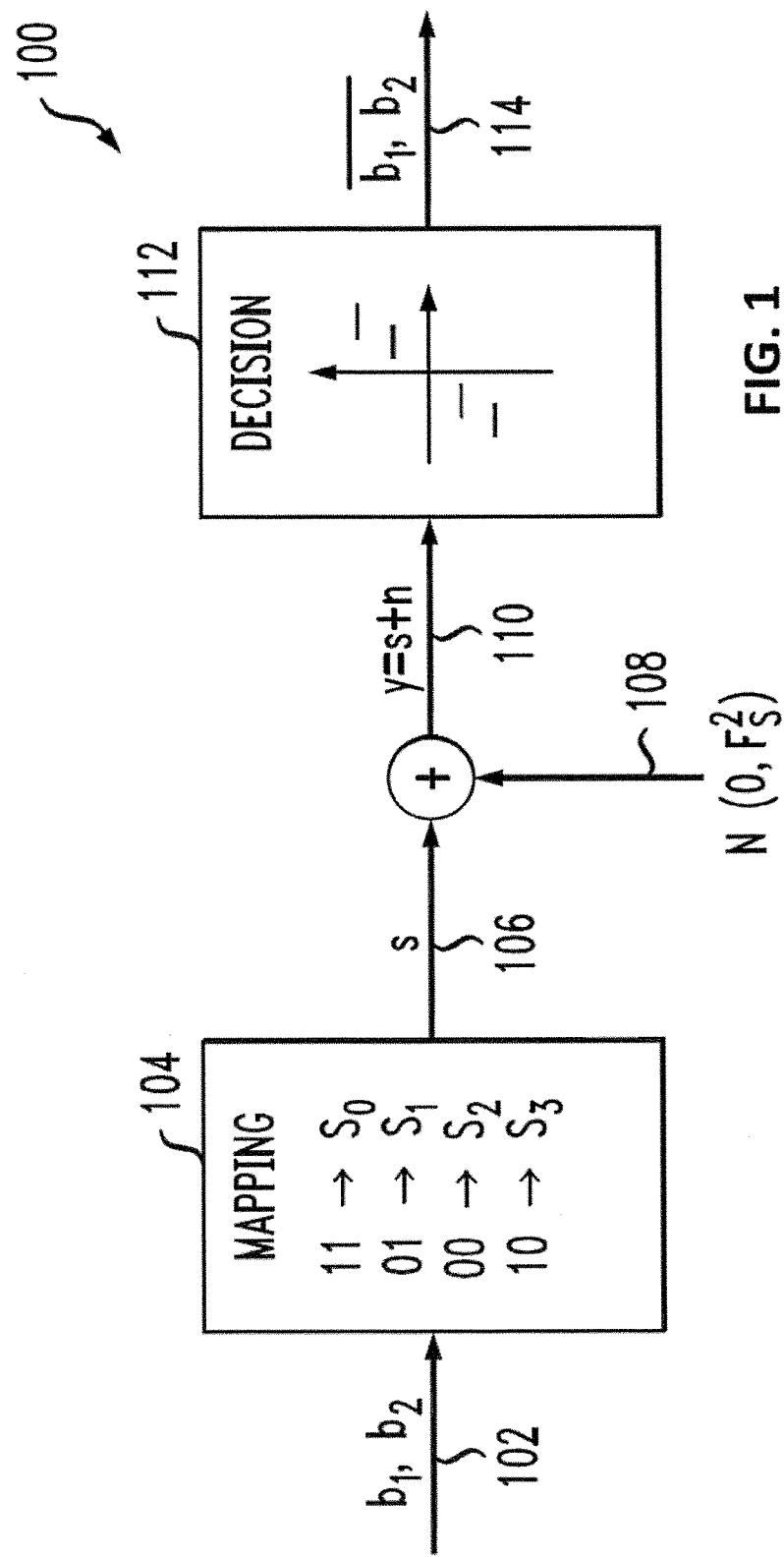
FIG. 1 illustrates a model of a non-volatile memory channel in which channel tracking can be used to adjust read retry reference voltages, in accordance with one or more embodiments of the present disclosure.

Illustrative embodiments will be described herein with reference to exemplary solid state storage devices and associated storage media, controllers, and other processing devices. It is to be appreciated, however, that these and other embodiments are not restricted to the particular illustrative system and device configurations shown. Accordingly, the term "solid state storage device" as used herein is intended to be broadly construed, so as to encompass, for example, any storage device implementing the independent read threshold voltage tracking techniques described herein. Numerous other types of storage systems are also encompassed by the term "solid state storage device" as that term is broadly used herein.

Various embodiments of the disclosure are directed to threshold voltage adjustment techniques for solid state memory devices, such as multi-level cell (MLC) NAND (Not And) flash memory devices. As used herein, a multi-level cell flash memory comprises a memory where each memory cell stores two or more bits. While the disclosure is illustrated herein using memory cells that store an analog value as a voltage, the present disclosure can be employed with any storage mechanism for memory devices, such as the use of voltages or currents to represent stored data, as would be apparent to a person of ordinary skill in the art.

As will be described, in one or more illustrative embodiments, independent read threshold voltage tracking profiling is performed to independently adjust dependent read threshold voltages for a memory to address variations in read threshold voltages as the solid state storage media evolves and/or degrades. In one exemplary embodiment, a controller adjusts a plurality of dependent read threshold voltages for a memory by identifying a substantially optimum value for a first dependent read threshold voltage, while setting the other dependent read threshold voltages to corresponding default values, and then separately identifying the substantially optimum value for each of the other dependent read threshold voltages. Dependent read threshold voltages, in some embodiments, may be identified based on Grey mapping and/or by identifying multiple page types written in the same codeword. For example, if a codeword spans multiple page types, the read threshold voltages needed to read the codeword are considered to be dependent read threshold voltages and must be optimized together using the disclosed independent read threshold voltage tracking techniques.

In one or more embodiments, the substantially optimum value for a given read threshold voltage is obtained by reading at least one codeword of multiple pages using a plurality of different values for the given read threshold voltage and identifying one of the plurality of different values of the given read threshold voltage having a substantially minimum syndrome weight as the substantially optimum value for the first read threshold voltage.

In some embodiments, the disclosed independent read threshold voltage tracking allows the substantially optimum value for multiple read threshold voltages to be obtained with only linear complexity in the number of read operations.

U.S. patent application Ser. No. 14/928,284, filed Oct. 30, 2015, now U.S. Pat. No. 9,818,488, entitled "Read Threshold Voltage Adaptation Using Bit Error Rates Based On Decoded Data," incorporated by reference herein, teaches that the bit error rate for the current read threshold voltage $V_i$ ($BER_S(V_i)$) can be estimated from the syndrome weight of the given page $P_j$. Generally, a syndrome is an estimate of the number of bits in error. The syndrome weight can be obtained, for example, from a syndrome weight calculator or a hard decision decoder for a specified number of iterations. In further variations, syndrome weights can be computed without first checking for convergence, or syndrome weight-based estimation of error counts can be omitted entirely. Thus, in various implementations, the syndrome weight-based estimation of error counts and the bit error rate computation for the current read threshold voltage $V_i$ can be performed independently, or can be combined.

Considered individually, each non-volatile memory cell has a particular stored (programmed) charge that corresponds to a device threshold voltage for that cell, and further corresponds to the logical bit values being stored in the cell. While, ideally, all of the cells in the non-volatile memory would have identical device threshold voltages for the logical bit values stored, in practice, for a variety of reasons, the device threshold voltages follow a probability distribution, e.g. a Gaussian distribution. Thus, considered in aggregate across a large number of cells, such as of a read unit, there are as many device threshold voltage distributions (e.g., Gaussian probability curves) as there are states per cell (two states per bit of storage per cell). That is, for N-bits per cell of storage, there are $2^N$ states and the same number of device threshold voltage distributions. Thus, $2^N-1$ different read reference voltages may be needed by read circuits in the non-volatile memory to distinguish between the $2^N$ states.

The device threshold voltage distributions vary from their initial/nominal distributions by one or more factors, such as read disturb, write disturb, and retention loss. More particularly, over time, temperature, and other factors related to use, the location of each of the device threshold voltage distributions can change with respect to the device threshold voltage axis. Such changes increase the likelihood of read errors that are performed using a read reference voltage value for the read threshold that was previously established based on the nominal device threshold voltage distribution. In some embodiments, when a hard-decision uncorrectable error is encountered in a read unit read from non-volatile memory, a series of read retry operations is performed to recover the read unit. The read retry operations include the controller re-reading the read unit with different reference voltages, as adjusted based on channel tracking.

The read retry reference voltage adjustment disclosed herein can be applied to both single-level cell (SLC) flash memories, where N=1, and to multi-level cell (MLC) flash memories, where N>1. Single-level cell memories store one bit per cell of storage, have two device threshold voltage distributions (one for zeroes and another for ones), and use a single read threshold, read reference voltage $V_{REF0}$. From lower to higher device threshold voltages, the two device threshold voltage distributions are known as the E (Erased) state and D1 (first Data) state. While arbitrary, a mapping or coding in some embodiments assigns logical one to the E state and logical zero to the D1 state. Thus, references to zeroes and ones are proxy references for respective decodings of the D1 state and the E state. Multi-level cell memories store more than one bit per cell, have more than two device threshold voltage distributions, and use multiple different read thresholds to distinguish the distributions. For example, a four level cell memory stores two bits per cell, has four device threshold voltage distributions, and generally uses three read thresholds (read voltage references $V_{REF1}$, $V_{REF2}$, and $V_{REF3}$). From lower to higher device threshold voltages, the four device threshold voltage distributions are known as the E (Erased), D1 (Data1), D2 (Data2), and D3 (Data3) states. While arbitrary, each of the four device threshold voltage distributions is also mapped (addressed) in accordance with a particular binary sequence, such as a Gray code sequence. Thus, references to one or more of the 11, 10, 00, and 01 states, are proxy references for respective decodings of the E, D1, D2, and D3 states.

For a single-level memory cell, a tracking module estimates the means and variances of the voltage distributions of states D1 and E, and sets the read reference voltage $V_{REF0}$ based on these distributions. The calculated $V_{REF0}$ will lie at the intersection of the distributions when zeroes (state E) and ones (state D1) are equally likely in the written data. A read control module initiates M data reads of the addressed page from the flash device to the read buffer, with the first read at a read reference voltage of $V_{REF0}$ and the subsequent read reference voltages at different levels around $V_{REF0}$ as determined by channel tracking of the means and variances of the voltage distributions of states D1 and E. For a multi-level memory cell, the tracking module estimates the means and variances of the voltage distributions of all states.

FIG. 1 illustrates a model of a non-volatile memory channel 100 in which channel tracking can be used to adjust read retry reference voltages in accordance with one or more embodiments of the present disclosure. Notably, two-bit inputs with four states are used in this example, although the read retry reference voltage adjustment disclosed herein is not limited to use with any particular bit width or number of states. For two input data bits 102, the two data bits 102 $b_1$, $b_2$ can be mapped to four possible states in a mapping 104. For example, value "11" for the two data bits 102 can be mapped to state so, value "01" to state $s_1$, value "00" to state $s_2$, and value "10" to state $s_3$. For a multi-level cell, the cell is programmed to a selected state 106 from the four possible states depending on the value of the two data bits 102. As voltages representing the selected state 106 are written to and read from the memory cell, noise 108 is added due to the programming process and other inefficiencies and disturbances, yielding a noisy cell voltage 110 $y$. The noise can be considered to be an additive white Gaussian noise (AWGN), with the noise variances being different depending on the signal transmitted.

Figure 2:
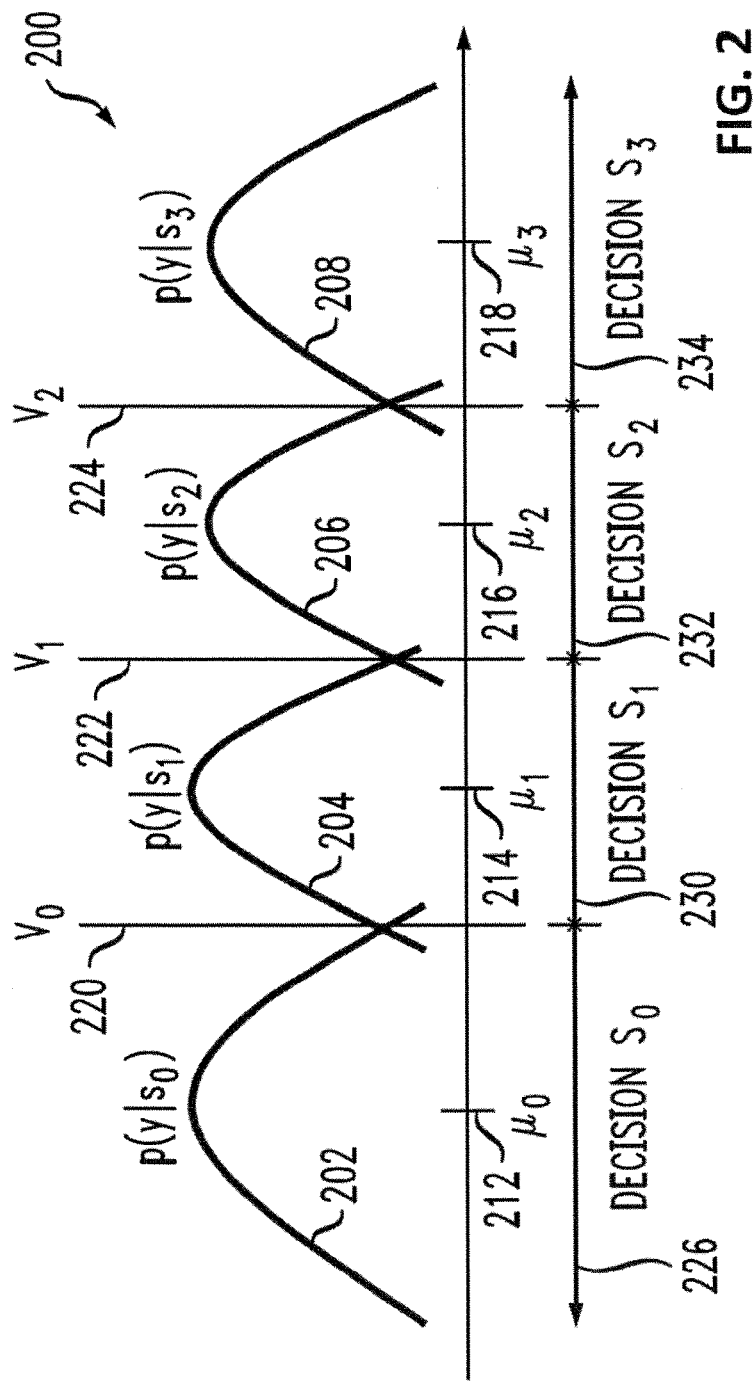
FIG. 2 is a graph of cell voltage distributions for a normal hard decision read, in accordance with some embodiments of the present disclosure.

FIG. 2 is a graph 200 of cell voltage distributions 202, 204, 206, 208 for a normal hard decision, read in accordance with some embodiments of the present disclosure. The resulting voltages read from the memory cell thus appear something like the distributions 202, 204, 206, 208 shown in the graph 200 of FIG. 2, rather than four distinct discrete voltage levels corresponding to the four states at the target state voltage levels 212, 214, 216, 218. Each distribution 202, 204, 206, 208 will have a mean roughly equal to the target voltage for the state, and the variance will depend upon the noise. Because the voltages on the memory cell are not accurate, the voltages read back can vary according to the distributions 202, 204, 206, 208. In some embodiments, during the initial read of the memory cell, reference voltages $V_0$ 220, $V_1$ 222 and $V_2$ 224 (also referred to herein as read threshold voltages) are used during a read to determine the state of the memory cell, returning hard decisions about the state of the memory cell.

In general, if the read voltage is below reference voltage 220, a decision (112, FIG. 1) indicates that the memory cell is determined to be in state $S_0$ 226. If the read voltage is above reference voltage $V_0$ 220 and below reference voltage $V_1$ 222, a decision indicates that the memory cell is determined to be in state $S_1$ 230, and a corresponding bit sequence 114 is generated. If the read voltage is above reference voltage $V_1$ 222 and below reference voltage $V_2$ 224, a decision indicates that the memory cell is determined to be in state $S_2$ 232. If the read voltage is above reference voltage $V_2$ 224, a decision indicates that the memory cell is determined to be in state $S_3$ 234, and a corresponding bit sequence 114 is generated.

In some embodiments, the read operation is divided into a process of reading least significant bit (LSB) pages and most significant bit (MSB) pages. States $S_0$ 226 and $S_1$ 230 correspond to a least significant bit value of 1, states $S_2$ 232 and $S_3$ 234 correspond to a least significant bit value of 0. When reading the least significant bit, the reference voltage $V_1$ 222 is applied to the memory cell, and if the voltage on the cell is above reference voltage $V_1$ 222 the least significant bit is interpreted as having a value of 0. If the voltage on the cell is below reference voltage $V_1$ 222 the least significant bit is interpreted as having a value of 1. States $S_0$ 226 and $S_3$ 234 are less likely to result in a read error than states $S_1$ 230 and $S_2$ 232, because their distributions 202 and 208 are further from the intersection of distributions 204, 206 associated with reference voltage $V_1$ 222. When reading the most significant bit, states $S_0$ 226 and $S_3$ 234 correspond to most significant bit value of 1, and states $S_1$ 230 and $S_2$ 232 correspond to most significant bit value of 0. To read the most significant bit pages, the decision criterion is different and a pair of reference voltages $V_0$ 220 and $V_2$ 224 are applied. The levels of reference voltages $V_0$ 220, $V_1$ 222 and $V_2$ 224 are supplied by a channel tracking module in some embodiments of the disclosure.

When reference voltages $V_0$ 220, $V_1$ 222 and $V_2$ 224 are used during a read to determine the state of the memory cell, it can result in a misread due to overlapping regions for neighboring distributions. For example, if the actual written state is $S_0$ corresponding to target state voltage level 212, but the read voltage is at the upper edge of distribution 202 above reference voltage $V_0$ 220, the decision will incorrectly identify state $S_1$ 230. In these cases, if low density parity check decoding of the data read from the non-volatile memory does not converge on the correct values and correct the errors, a retry operation is initiated.

During the read retry operation, the non-volatile memory controller enters into a sort low density parity check decoding operation, in which soft data is used as the input to the low density parity check decoder. In retry, multiple reads of a memory page are performed at different read reference voltages to obtain a quantized version of the stored voltage on the cell. Afterwards, the multiple read pattern for each bit is then mapped to a log likelihood ratio (LLR) that represents the confidence level of the bit value being 0 or 1. Finally, the log likelihood ratios are passed as the soft data input to the low density parity check decoder to recover the written data.

Figure 3:
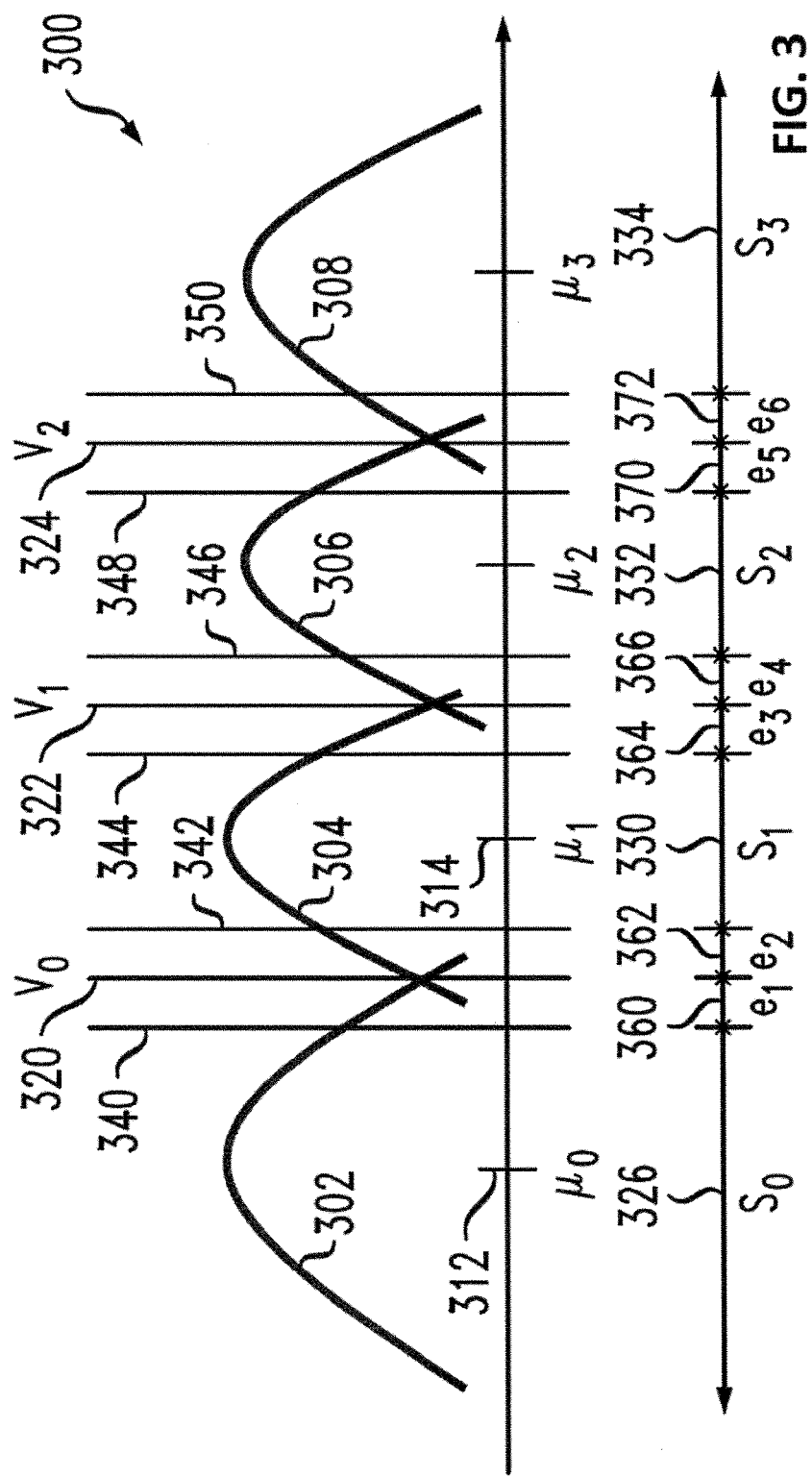
FIG. 3 is a graph of cell voltage distributions for cell voltages in different states for a retry soft decision read, in accordance with some embodiments of the present disclosure.

FIG. 3 is a graph 300 of cell voltage distributions 302, 304, 306, 308 for cell voltages in different states for a retry soft decision read in accordance with some embodiments of the present disclosure. During read retries, soft decision data is generated by applying additional reference voltages 340, 342, 344, 346, 348, 350 in addition to reference voltages $V_0$ 320, $V_1$ 322 and $V_2$ 324. By performing additional read operations using different reference voltages (e.g., 344, 346), additional regions or states are defined, such as main state $S_0$ 326, $S_1$ 330, $S_2$ 332, and $S_3$ 334, and new intermediate states $e_1$ 360, $e_2$ 362, $e_3$ 364, $e_4$ 366, $e_5$ 370, and $e_6$ 372. Each is assigned a state value (e.g., {111}, {011}, {001}).

For example, when, reading a least significant bit page, reference voltages 344, 322, 346 are applied in a series of read operations to determine if the least significant bit is a "0", with the memory cell in either state $S_2$ 332, or $S_3$ 334, or if the least significant bit is a "1", with the memory cell in either state $S_0$ 326, $S_1$ 330. Given three reference voltages 344, 322, 346, the hard decisions will have three bit values. Although reference voltages can be applied in a number of different orders, affecting the hard decision results, one example of the hard decision values for three reference voltages 344, 322, 346 applied in that order is as follows. If the read voltage is below all three reference voltages 344, 322, 346 to the left of reference voltage 344, the hard decision is {111}. If the read voltage is above reference voltage 344 and below reference voltages 322, 346, the hard decision is {011}. If the read voltage is above reference voltages 344, 322 and below reference voltage 346, the hard decision is {001}. If the read voltage is above all three reference voltages 344, 322, 346, the hard decision is {000}. The hard decision can be generated bit by bit by applying each of the three reference voltages 344, 322, 346 in three successive read operations.

When reading a most significant bit page, reference voltages 340, 320, 342 and 348, 324, 350 are applied in a series of read operations to determine if the most significant bit is a "0", with the memory cell in either state $S_1$ 330 or $S_2$ 332, or if the most significant bit is a "1", with the memory cell in either state $S_0$ 326 or $S_3$ 334. If the read voltage is below reference voltage 340, the hard decision is {111}. If the read voltage is between reference voltages 340 and 320, the hard decision is {011}. If the read voltage is between reference voltages 320 and 342, the hard decision is {001}. If the read voltage is between reference voltages 342 and 348, the hard decision is {000}. If the read voltage is between reference voltages 348 and 324, the hard decision is {100}. If the read voltage is between reference voltages 324 and 350, the hard decision is {110}. If the read voltage is above reference voltage 350, the hard decision is {111}.

Notably, the likelihood that the value read from a memory cell is correct differs based on the state that is read. For example, if the read retry results in a hard decision corresponding to state $S_0$ 326, the likelihood that the memory cell actually contains the value associated with target state voltage level 312 is greater than if the read retry results in a hard decision corresponding to state $e_1$ 360, because state $S_0$ 326 is further from the intersection of distributions 302 and 304 than state $e_1$ 360.

The hard decisions of read operations can be converted into soft decisions (log likelihood ratio values) based on the knowledge of the channel. The hard decision for state $S_0$ 326 will therefore have a higher log likelihood value than the hard decision for state $e_1$ 360. A log likelihood ratio for a memory cell contains the likelihood for each possible value of the memory cell that the cell contains that value. Thus, given a four state memory cell, the corresponding log likelihood ratio for data stored in the memory cell will have four probability or likelihood values, each giving the likelihood that the memory cell contains one of the four possible values. The log likelihood ratio values are generated from the read retry operation hard decisions in any suitable manner. Based upon the disclosure provided herein, one of ordinary skill in the art will recognize a variety of techniques and equations for calculating log likelihood ratio values from the read retry operation hard decisions. In some embodiments, the log likelihood ratio values are pre-calculated for each possible read retry operation hard decision, based on expected channel characteristics, and stored in a lookup table for use during operation.

In some embodiments, when data from a read retry operation fails to converge in the decoder, another read retry operation is triggered, with a greater number of reference voltages applied, giving higher quality soft decisions to be provided to the decoder. Such a process of increasing the number of reference voltages can be continued as long as desired until a maximum number of retries is reached and a read failure is signaled.

The adjustment of read retry reference voltages disclosed herein adjusts the reference voltages to achieve a prescribed log likelihood ratio table that is designed to achieve low density parity check decoding convergence with a lower number of read retries.

Initially, the location of the intersections between distributions (e.g., 302, 304) is not known. If the read reference voltages are positioned so that read values are captured near the center of distributions (e.g., 302), the full range of the resulting log likelihood ratios will not be used and the hard read bit error rate will not be minimized. For example, if log likelihood ratios are represented using three signed bits, the range of possible log likelihood ratios is from −7 to 7. In one or more embodiments, channel tracking is performed and an algorithm is applied to inversely find the read reference voltages that will use the full resolution of possible log likelihood ratios, rather than concentrating the log likelihood ratios at the edges of the available range.

In some embodiments, die channel tracking-based read reference voltage adjustment is applied in a read retry operation. In these embodiments, a hard read is, performed first, reading hard decisions and decoding those hard decisions. The hard decisions can be mapped to log likelihood ratio values for a low density parity check decoder with a soft information input, by mapping a 0 value from the memory cell to a large negative log likelihood ratio value corresponding to a 0 value, and mapping a 1 value from the memory cell to a large positive log likelihood ratio value corresponding to a 1 value.

If the decoding fails, then the read retry operation is initiated, and a soft read is performed, yielding soft information or log likelihood ratios that are decoded. In a soft read, multiple reads of a page are performed at different read reference voltages to obtain a quantized version of the stored voltage on the memory cell. The multi-bit read patterns from the memory cell are mapped to log likelihood ratios that represent the confidence level of the bit value being 0 or 1, using a lookup table. The log likelihood ratios are passed to a decoder, such as, but not limited to, a low density parity check decoder performing soft decoding, to recover the written data. An algorithm is implemented to inversely identify the reference voltages that will populate the lookup table, under the assumption that the read voltage distributions have a substantially Gaussian distribution.

In some embodiments, the algorithm to inversely identify the reference voltages that will populate the lookup table to map to log likelihood ratios is a greedy algorithm, meaning that it considers all possible values of the read reference voltages before reaching a solution for the read reference voltages to be used. It is also an inverse algorithm, meaning that it starts with the possible log likelihood ratios and then identities the read reference voltages that will result in quantized voltages that map to log likelihood ratios that use the full resolution. By utilizing the hall log likelihood ratio resolution, the low density parity check decoding is able to converge on the correct written values in a lower number of read retries. With proper choice of read reference voltages, it is observed that the limited spectrum of log likelihood ratios does not impair performance of the low-density parity-check decoder. In some embodiments, the low density parity check decoding comprises a min-sum decoding algorithm, although the channel tracking-based read retry voltage adjustment is not limited to use with any particular type of decoder.

Figure 4:
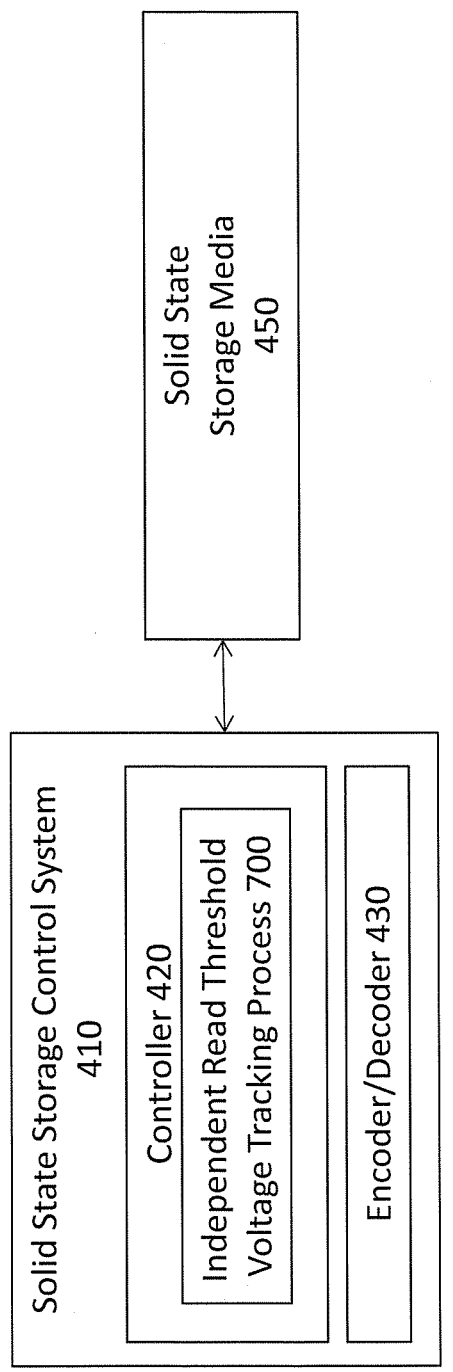
FIG. 4 is a schematic block diagram of a solid state storage system, in an illustrative embodiment of the present disclosure.

FIG. 4 is a schematic block diagram of an illustrative solid state storage system 400. As shown in FIG. 4, the illustrative solid state memory system 400 comprises a solid state storage control system 410 and a solid state storage media 450. The exemplary solid state storage control system 410 comprises a controller 420 and an encoder/decoder block 430. In an alternative embodiment, the encoder/decoder block 430 may be implemented inside the controller 420.

As shown in FIG. 4, the controller 420 comprises an independent read threshold voltage tracking process 700, discussed below in conjunction with FIG. 7, to implement the independent read threshold voltage tracking techniques described herein. The encoder/decoder block 430 may be implemented, for example, using well-known commercially available techniques and/or products. The encoder within the encoder/decoder block 430 may implement, for example, error correction encoding, such as a low-density parity-check (LDPC) encoding. The decoder within the encoder/decoder block 430 may be embodied, for example, as a hard decision decoder, such as a hard decision low-density parity-check (HLDPC) decoder.

The solid state storage media 450 comprises a memory array, such as a single-level or multi-level cell flash memory, a NAND flash memory, a phase-change memory (PCM), a magneto-resistive random access memory (MRAM), a nano RAM (NRAM), a NOR (Not OR) flash memory, a dynamic RAM (DRAM) or another non-volatile memory (NVM). While the disclosure is illustrated primarily in the context of a solid state storage device (SSD), the disclosed independent read threshold voltage tracking techniques can be applied in solid state hybrid drives (SSHD) and other storage devices, as would be apparent to a person of ordinary skill in the art based on the present disclosure.

Figure 5:
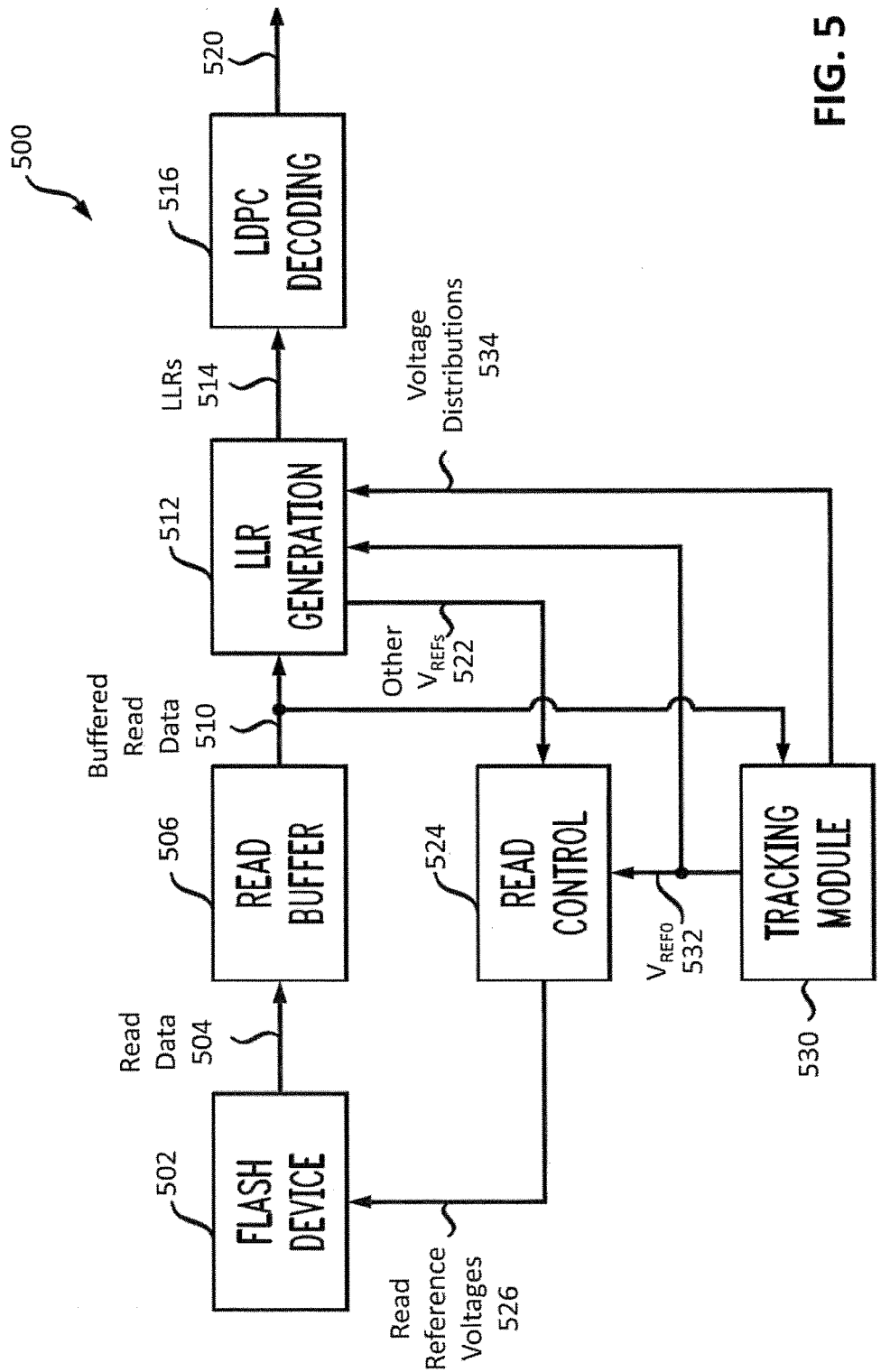
FIG. 5 illustrates a flash channel read path with adaptive read threshold voltage tracking, in accordance with some embodiments of the present disclosure.

FIG. 5 illustrates a flash channel read path 500 with channel tracking-based read retry voltage adjustment in accordance with some embodiments of the present disclosure. The read path 500 includes a flash device having an array of memory cells, or any other type of non-volatile memory. Based upon the disclosure provided herein, one of ordinary skill in the art will recognize a variety of storage technologies that can benefit from the bit error rate-based read threshold voltage adjustments disclosed herein.

Read reference voltages 526 are applied to the flash device 502 by a read control device 524 in a series of N reads. Each memory cell is read N times, and the N reads result in read data 504 containing N bits per memory cell as a quantized version of the stored voltage on the memory cell. The read data 504 is buffered in a read buffer 506, and buffered read data 510 from read buffer 506 is provided to a log likelihood ratio generation circuit 512 (or likelihood generator, which can also be adapted to use plain likelihood values). The N bits for a memory cell are mapped to log likelihood ratios for the memory cell in log likelihood ratio generation circuit 512. In some embodiments, the log likelihood ratio generation circuit 512 contains a lookup table that maps the read patterns in buffered read data 510 to log likelihood ratios. The log likelihood ratio generation circuit 512 generates LLRs 514 that are processed by an LDPC decoding module 516 to generate a decoded value 520, in a known manner.

A tracking module 530 receives the buffered read data 510 from the read buffer 506, or from any other suitable source. Generally, channel tracking techniques adapt to the changes in read threshold voltages to maintain a desired performance level. Adaptive tracking algorithms typically track variations in the solid state storage channel and consequently, help to maintain a set of updated channel parameters. The updated channel parameters are used, for example, to adjust read threshold voltages. United States Published Patent Application No. 2013/0343131, filed Jun. 26, 2012, entitled "Fast Tracking For Flash Channels," and/or United States Published Patent Application No. 2015/0287453, entitled "Optimization of Read Thresholds for Non-Volatile Memory," now U.S. Pat. No. 9,595,320) incorporated by reference herein in their entirety, disclose techniques for adapting read threshold voltages.

The tracking module 530 identifies the intersection point between neighboring voltage distributions (e.g., 302, 304) for a memory cell that corresponds to zero log likelihood ratio, and provides read reference voltage level $V_{REF0}$ 532, including the read reference voltage $V_{REF0}$ corresponding to the intersection. When the read reference voltage $V_{REF0}$ corresponding to the intersection is used for the soft read operation, it will result in a reduction in the bit error rate. The read reference voltage $V_{REF0}$ is used in some embodiments as the first read reference voltage of a read retry operation, and additional mad reference voltages around $V_{REF0}$ to obtain substantially all possible log likelihood ratio values. The tracking module 530 thus generates the read reference voltage level $V_{REF0}$ 532 to be used in read retry operations. In other embodiments $V_{REF0}$ may not correspond to the intersection of the distributions depending on the tracking algorithm design, tracking inaccuracy, or the actual channel distributions deviating from Gaussian behavior in either the peak or the tail. In other situations, $V_{REF0}$ may coincide with the intersection of the distributions but may not be applied first and that would be accounted for in the calculations in 512 and 524.

The tracking module 530 also tracks the voltage distributions 534 (e.g., 302, 304). In some embodiments, the tracking module 530 calculates the voltage distribution means and variances for each voltage distribution 534 corresponding to each possible state in each memory cell. The voltage distributions 534 can be calculated in any suitable manner based on the read data. As an example, the tracking module 530 can operate as disclosed in U.S. Published Patent Application No. 2013/0343131, filed Jun. 26, 2012, entitled "Fast Tracking for Flash Channels," incorporated by reference herein in its entirety. In some embodiments, the tracking module 530 tracks intersections without estimating means or variances.

For a two-state memory cell, or single-level memory cell, the tracking module 530 estimates the means and variances of the voltage distributions of states "1" and "0", as well as the read reference voltage $V_{REF0}$ that most reduces the bit error rate and which likely lies at the intersection of those distributions when 0's and 1's are equally likely in the written data.

The tracking module 530 provides the voltage distributions 534 to the log likelihood ratio generation circuit 512 for use in updating the log likelihood ratio lookup table. The log likelihood ratio generation circuit 512 is used to calculate likelihood values for decoding purposes. The log likelihood ratio generation circuit 512 also determines where to place the other N−1 read reference voltages around $V_{REF0}$ 532 based on the voltage distributions 534 and on the read reference voltage $V_{REF0}$ 532 to obtain substantially all possible log likelihood ratio values when the read patterns in buffered read data 510 are mapped to log likelihood ratios. The log likelihood ratio generation circuit 512 determines where to place the other N−1 read reference voltages around $V_{REF0}$ 532, updates the lookup table, and provides the N−1 read reference voltage levels 522 to a read controller 524. It is important to note that the division of functionality is not limited to the example embodiments disclosed herein. For example, in other embodiments, the tracking module 530 calculates and provides read reference voltages around $V_{REF0}$ 532 and provides those voltages to the log, likelihood ratio generation circuit 512, rather than the log likelihood ratio generation circuit 512 determining where to place the other N−1 read reference voltages around $V_{REF0}$ 532, and these divisions of functionality are to be seen as equivalent.

The read reference voltages are stored in log likelihood ratio generation circuit 512 in some embodiments, as calculated based on the log likelihood ratio lookup table in log likelihood ratio generation circuit 512 and on the voltage distribution means and variances 534 from tracking module 530.

The read controller 524 controls read retry operations in the flash device 502, providing each of the N read reference voltages (including $V_{REF0}$ 532) to be used when reading the memory cells in the flash device 502. The read controller 524 initiates N reads of a page, with the first read using read reference voltage $V_{REF0}$ in some embodiments, and with the subsequent N−1 reads at read references voltages around $V_{REF0}$ as determined by log likelihood ratio generation circuit 512.

Figure 6:
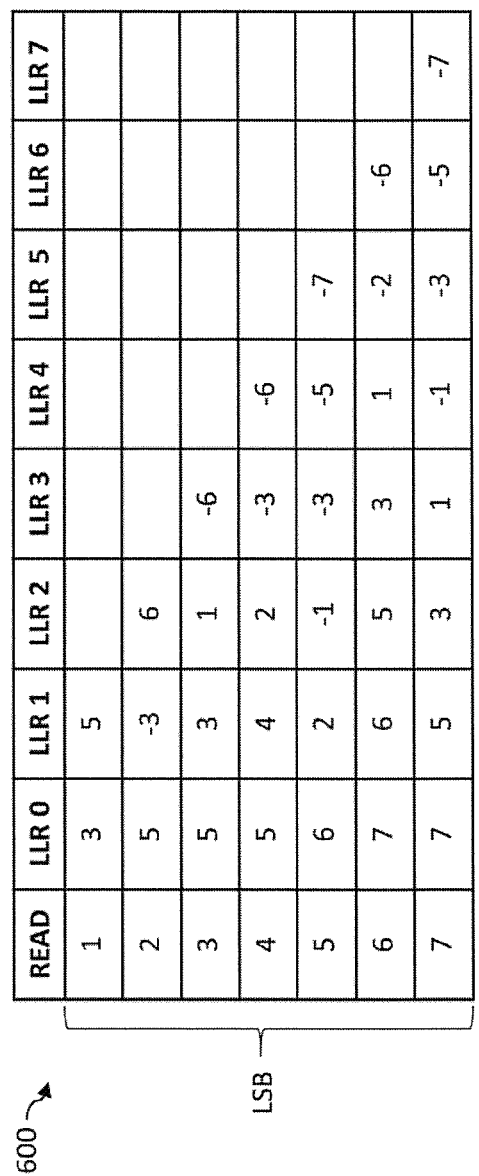
FIG. 6 is a lookup table of default log likelihood ratio values for a plurality of read retry operations, in accordance with one or more embodiments of the present disclosure.

FIG. 6 is a lookup table 600 of default log likelihood ratio values for the least significant bits (LSBs) for a plurality of read retry operations. Table 600 generally illustrates a lookup table for a two-bit per cell type memory. Table 600 is stored, for example, by read controller 424. A center of the voltage sweep window being retried, and thus the initial read retry in FIG. 3, is chosen to reduce the corresponding lower page and upper page bit error rates. Lowering the bit error rates uses side information, available in the form of the means μ and variances σ of the charge-state probability distributions 302, 304, 306, 308. However, if such information about the statistics of a certain state is not readily available, the corresponding log likelihood ratio values cannot be computed as the means and variances to plug into the likelihood computation formulas would not be available. In other scenarios, obtaining such information is costly, inaccurate, or is not supported by the flash architecture in an efficient manner.

In such situations, a default lookup table (e.g., LUT) can be used to map decision regions (e.g., multi-read patterns) into predefined log likelihood ratio values. In one or more embodiments, different tables can be maintained for different flash types and/or different channel conditions. For example, different lookup tables are stored for different program/erase cycle (e.g., PEC) points or read disturb cycles. In addition, different log likelihood ratio values can be maintained by the controller 424 for odd and even wordlines in even-odd architectures, or for single level cell (e.g., SLC) blocks, embedded single-level cell pages, or lower page only (e.g., LPO) pages. Those lookup tables can be modified dynamically (e.g., on the fly) based on some metric or based on some representative characterization of the flash part that pertains to the current measured channel condition (such as endurance, retention, or read disturb etc.) or specific to the current geometry (even/odd wordline, middle/edge wordline, or middle/edge block).

The lookup table 600 for LSBs in the embodiment of FIG. 6 is easily extendable to MSB pages with two or more sensing reference voltages by a person of ordinary skill in the art. Exemplary LLRs for MSBs are shown, for example, in FIG. 8. In general a flash page type can have multiple sensing voltages even above two, such as in TLC flash devices. In such cases, the size of the LLR lookup table 600 will grow accordingly as function of the number of reference voltages to read a page. The decision regions surrounding each of the reference voltages can be distinguished by doing extra reads of other pages in the same wordline or based on the multiple-bit read patterns, in all cases, the concepts and rules disclosed herein can be extended to such pages to calculate LLRs for pages with multiple reference voltages.

In this manner, at each read retry, different LLR constellations are invoked based on metrics, such as disparity, syndrome weight of previous decoding attempt and/or history of such metrics. In one or more embodiments, the LLR lookup table 600 targets various scenarios, such as endurance, retention, read disturb, variation across dies and variation across pages.

In one or more embodiments, the LLR values stored in the table 600 (or generated dynamically in an alternate implementation) can be adjusted based on channel conditions and decoding performance. Specifically, the read retry algorithm can keep track of the history of successful read voltages and use them to re-rank the read reference voltages, $V_{REF}$, for the page populations.

Figure 7:
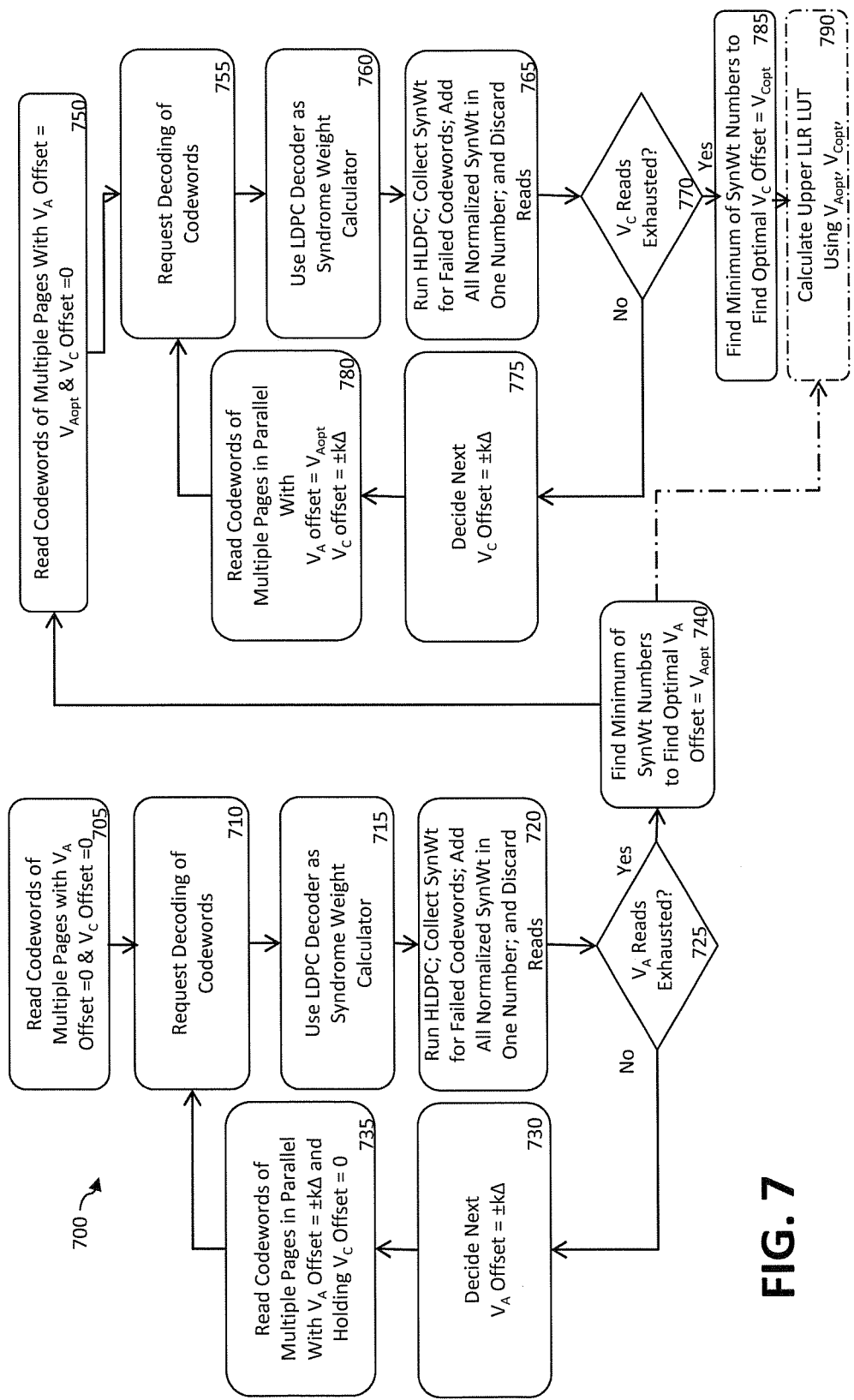
FIG. 7 is a flow chart illustrating an exemplary implementation of an independent read threshold voltage tracking process, according to one embodiment of the disclosure.

FIG. 7 is a flow chart illustrating an exemplary independent read threshold voltage tracking process 700 incorporating aspects of the present invention. As discussed above in conjunction with FIG. 2, read threshold voltages $V_0$ 220, $V_1$ 222 and $V_2$ 224 (also referred to herein as $V_A$, $V_B$, and $V_C$, respectively) are used during a read to determine the state of the memory cell, returning hard decisions about the state of the memory cell. The read threshold voltages $V_A$ and $V_C$ are both associated with the most significant bit (MSB) and are thus dependent on one another. Generally, the exemplary independent read threshold voltage tracking process 700 performs independent read threshold voltage tracking for the dependent read threshold voltages $V_A$ and $V_C$, by separating the tracking of the read threshold voltages $V_A$ and $V_C$. Among other benefits, the exemplary independent read threshold voltage tracking process 700, in some embodiments, allows the substantially optimum value for multiple read threshold voltages to be obtained with only linear complexity in the number of read operations (as opposed to an exponential complexity with bit error rate-based methods).

In the exemplary embodiment of FIG. 7, adaptive voltage tracking is first performed for $V_A$, while $V_C$ is held at a default value. Once the substantially optimum read threshold voltage is found for $V_A$, the substantially optimum read threshold voltage is then found for read threshold voltage $V_C$, while $V_A$ is held at the determined substantially optimum read threshold voltage.

As shown in FIG. 7, the exemplary independent read threshold voltage tracking process 700 initially reads the codewords of multiple pages during step 705 with $V_A$ set to an offset of 0V and $V_C$ set to a default value (e.g., Offset=0). The exemplary independent read threshold voltage tracking process 700 then requests a decoding of the codewords during step 710, for example, using a hard low density parity check (HLDPC) decoder.

In the exemplary embodiment of FIG. 7, the LDPC Decoder is used as a syndrome weight calculator during step 715. In further embodiments, dedicated hardware (e.g., a syndrome weight calculator) can be used to obtain the syndrome weight.

During step 720, the HLDPC decoder is executed and the syndrome weight is collected for failed codewords. In addition, the normalized syndrome weight for each failed decoding attempt for the plurality of values of the first read threshold voltage is aggregated into one number, and the read values are discarded. In one or more embodiments, normalization is based on modifying the syndrome weight to account for the differences in code parameters between pages. For a more detailed discussion of normalizing syndrome weights, see, for example, U.S. patent application Ser. No. 15/639,019, now U.S. Pat. No. 10,180,868, filed contemporaneously herewith, entitled "Adaptive Read Threshold Voltage Tracking With Bit Error Rate Estimation Based On Non-Linear Syndrome Weight Mapping," incorporated by reference herein.

A test is performed during step 725 to determine if a predefined limit on the number of $V_A$ read operations has been reached. If it is determined during step 725 that predefined limit, on the number of $V_A$ read operations has not been reached, then the $V_A$ offset (e.g., $\pm k\Delta$) is determined during step 730 for the next read operation. The value of $\pm k\Delta$ is chosen in the direction of decreasing syndrome weight or can be decided using a predetermined set of steps offline. The codewords of multiple pages are then read in parallel during step 735 with $V_A$ set to the determined offset, and $V_C$ held at the default value. Program control then returns to step 710 and continues on the manner described above.

If, however, it is determined during step 725 that predefined limit on the number of $V_A$ read operations has been reached, then the substantially minimum syndrome weight is determined during step 740 to find the substantially optimal $V_A$ offset ($V_{Aopt}$). Program control then proceeds to step 750 to determine a substantially optimum value for $V_C$.

As shown in FIG. 7, the exemplary independent read threshold voltage tracking process 700 then reads the codewords of multiple pages during step 750 with $V_A$ set to the determined substantially optimal $V_A$ offset ($V_{Aopt}$), and $V_C$ set to an offset of 0V. The exemplary independent read threshold voltage tracking process 700 then requests a decoding of the codewords during step 755, for example, using the HLDPC decoder. In the exemplary embodiment of FIG. 7, the LDPC Decoder is used as a syndrome weight calculator during step 760.

During step 765, the HLDPC decoder is executed and the syndrome weight is collected for failed codewords. In addition, as discussed above for step 720, the normalized syndrome weight for each failed decoding attempt for the plurality of values of the second read threshold voltage is aggregated into one number, and the read values are discarded.

A test is performed during step 770 to determine if a predefined limit on the number of $V_C$ read operations has been reached. If it is determined during step 770 that predefined limit on the number of $V_C$ read operations has not been reached, then the $V_C$ offset (e.g., $\pm k\Delta$) is determined during step 775 for the next read operation (in a similar manner as step 730). The codewords of multiple pages are then read in parallel during step 780 with $V_C$ set to the determined offset, and $V_A$ held at the determined substantially optimal $V_A$ offset ($V_{Aopt}$). Program control then returns to step 755 and continues on the manner described above.

If, however, it is determined during step 770 that predefined limit on the number of $V_C$ read operations has been reached, then the substantially minimum syndrome weight is determined during step 785 to find the substantially optimal $V_C$ offset ($V_{Copt}$).

As shown in FIG. 7, the exemplary independent read threshold voltage tracking process 700 can optionally calculate the LLR lookup table 600 (FIG. 6) for the MSB page during step 790 using the determined substantially optimal offsets for $V_A$ and $V_C$ ($V_{Aopt}$ and $V_{Copt}$), as discussed further below in conjunction with FIGS. 11 and 12.

It has been found that after the substantially optimal $V_C$ offset ($V_{Copt}$) has been determined in step 785, the determined substantially optimal $V_A$ offset ($V_{Aopt}$) may no longer be valid. Thus, the exemplary independent read threshold voltage tracking process 700 can optionally be repeated using the new substantially optimal $V_C$ offset ($V_{Copt}$), as discussed further below in conjunction with FIGS. 8-10, until a desired bit error rate is obtained and/or the bit error rate does not improve for a predefined number of iterations. In this manner, the codewords of the multiple pages using the plurality of different values of the first read threshold voltage can be repeated, starting with the substantially optimum value for the first read threshold voltage ($V_{Aopt}$), and the substantially optimum value for the second read threshold voltage ($V_{Copt}$).

Figure 8A:
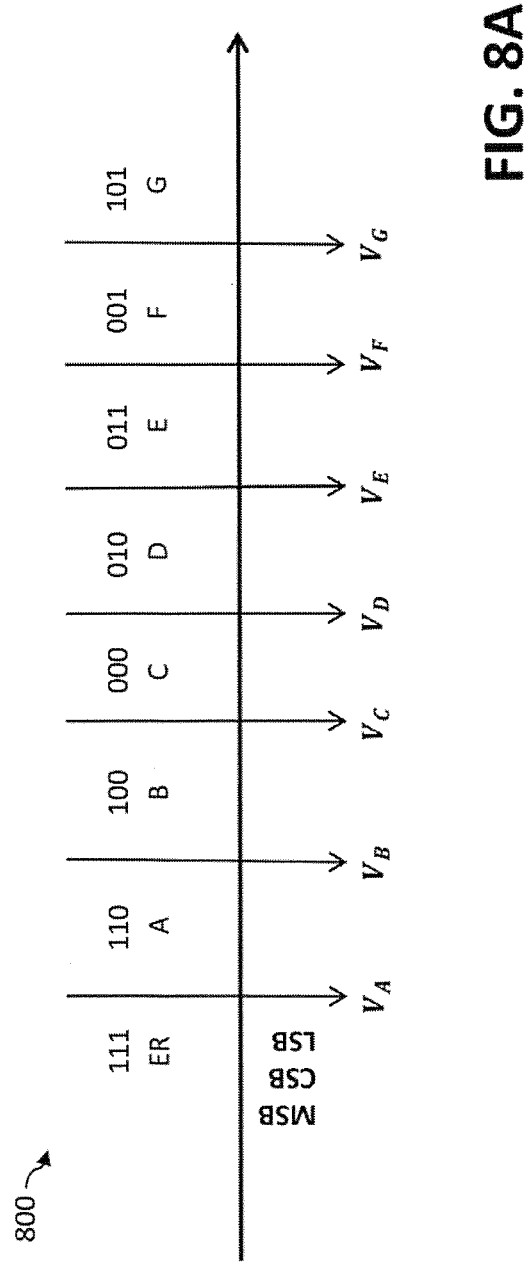
FIGS. 8A, 9A and 10A illustrate exemplary read threshold voltage assignments for corresponding exemplary triple-level cell flash memory devices, according to some embodiments of the disclosure.

FIG. 8A illustrates an exemplary read threshold voltage assignment 800 for an exemplary 2/3/2 triple-level cell (TLC) flash memory device, according to one embodiment of the disclosure. Generally, an exemplary 2/3/2 TLC flash memory device represents a least significant bit (LSB) using two read threshold voltages ($V_A$ and $V_E$); a center significant bit (CSB) using three read threshold voltages ($V_B$, $V_D$ and $V_F$); and a most significant bit (MSB) using two read threshold voltages ($V_C$ and $V_G$). FIG. 8A illustrates the exemplary read threshold voltage assignment 800 for read threshold voltages $V_A$ through $V_G$, to create eight decision regions (Erase Region (ER) and Regions A through G), and the corresponding bit assignments in each region for the LSB, CSB and MSB bits.

Figure 8B:
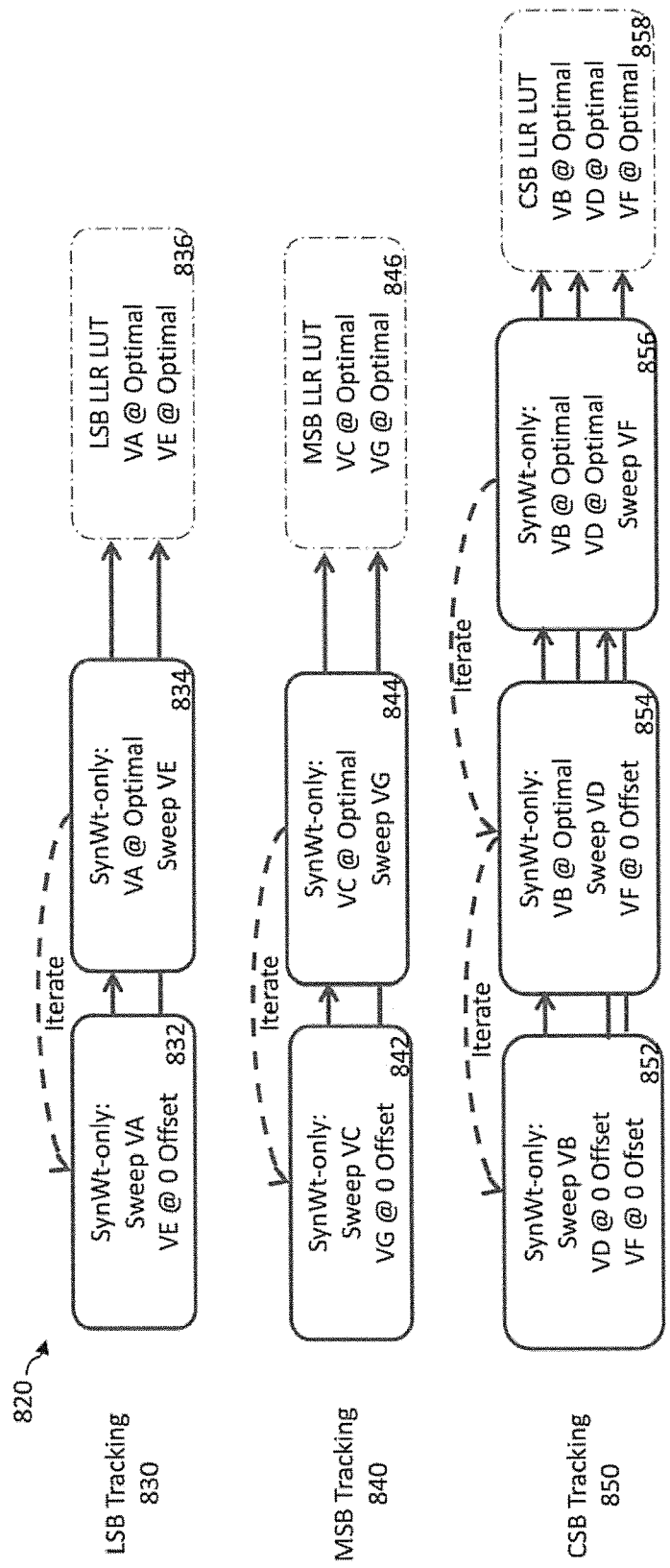
FIGS. 8B, 9B and 10B illustrate exemplary independent read threshold voltage tracking processes for the read threshold voltage assignments of FIGS. 8A, 9A and 10A, respectively, according to some embodiments of the disclosure.

FIG. 8B illustrates an exemplary independent read threshold voltage tracking process 820 for the read threshold voltage assignment 800 of FIG. 8A, according to an embodiment of the disclosure. The exemplary independent read threshold voltage tracking process 820 recognizes, for example, that the two read threshold voltages ($V_A$ and $V_E$) for the LSB are dependent and must be tracked together, using the disclosed independent read threshold voltage tracking techniques (and likewise, the three read threshold voltages ($V_B$, $V_D$ and $V_F$) for the CSB and the two read threshold voltages ($V_C$ and $V_G$) for the MSB).

As shown in FIG. 8B, in one or more embodiments, the exemplary independent read threshold voltage tracking process 820 performs LSB tracking 830 of the corresponding two read threshold voltages ($V_A$ and $V_E$) by sweeping read threshold voltage $V_A$ during step 832 to determine the $V_A$ offset with the substantially minimum syndrome weight value and holding read threshold voltage $V_E$ at a default value; and then sweeping read threshold voltages $V_E$ during step 834 to determine the $V_E$ offset with the substantially minimum syndrome weight value and holding read threshold voltages $V_A$ at the determined substantially optimal $V_A$ offset ($V_{Aopt}$). Then, the exemplary LSB tracking 830 optionally calculates the LLR lookup table 600 (FIG. 6) for the LSB page during step 836 using the determined substantially optimal offsets for $V_A$ and $V_E$ ($V_{Aopt}$ and $V_{Eopt}$), as discussed farther below in conjunction with FIGS. 11 and 12.

The exemplary independent read threshold voltage tracking process 820 then performs MSB tracking 840 of the corresponding two read threshold voltages ($V_C$ and $V_G$) by sweeping read threshold voltage $V_C$ during step 842 to determine the $V_C$ offset with the substantially minimum syndrome weight value and holding read threshold voltages $V_G$ at a default value; and then sweeping read threshold voltages $V_G$ during step 844 to determine the $V_G$ offset with the substantially minimum syndrome weight value and holding read threshold voltage $V_C$ at the determined substantially optimal $V_C$ offset ($V_{Copt}$). Then, the exemplary MSB tracking 840 optionally calculates the LLR lookup table 600 (FIG. 6) for the MSB page during step 846 using the determined substantially optimal offsets for $V_C$ and $V_G$ ($V_{Copt}$ and $V_{Gopt}$), as discussed further below in conjunction with FIGS. 11 and 12.

The exemplary independent read threshold voltage tracking process 820 then performs CSB tracking 850 of the corresponding three read threshold voltages ($V_B$, $V_D$ and $V_F$) by sweeping read threshold voltage $V_B$ during step 852 to determine the $V_B$ offset with the substantially minimum syndrome weight value and holding read threshold voltages $V_D$ and $V_F$ at default values; sweeping read threshold voltages $V_D$ during step 854 to determine the $V_D$ offset with the substantially minimum syndrome weight value and holding read threshold voltage $V_B$ at the determined substantially optimal $V_B$ offset ($V_{Bopt}$) and $V_F$ at a default value; and then sweeping read threshold voltages $V_F$ during step 856 to determine the $V_F$ offset with the substantially minimum syndrome weight value and holding read threshold voltages $V_B$ and $V_D$ at the determined substantially optimal offsets for $V_B$ and $V_D$ ($V_{Bopt}$ and $V_{Dopt}$). Then, the exemplary CSB tracking 850 optionally calculates the LLR lookup table 600 (FIG. 6) for the CSB page during step 858 using the determined substantially optimal offsets for $V_B$, $V_D$ and $V_F$ ($V_{Bopt}$, $V_{Dopt}$ and $V_{Fopt}$), as discussed further below in conjunction with FIGS. 11 and 12.

As shown in FIG. 8B, in one or more embodiments, the exemplary independent read threshold voltage tracking process 820 can optionally repeat (e.g., by iterating) the LSB tracking 830 and the MSB tracking 840 using the new substantially optimal read threshold voltages (e.g., ($V_{Aopt}$ and $V_{Copt}$), until a desired bit error rate is obtained and/or the bit error rate does not improve for a predefined number of iterations. Likewise, the exemplary independent read threshold voltage tracking process 820 can optionally repeat (e.g., by iterating) the CSB tracking 850 using the new substantially optimal read threshold voltages (e.g., ($V_{Bopt}$ and $V_{Dopt}$), until a desired bit error rate is obtained and/or the bit error rate does not improve for a predefined number of iterations.

Figure 9A:
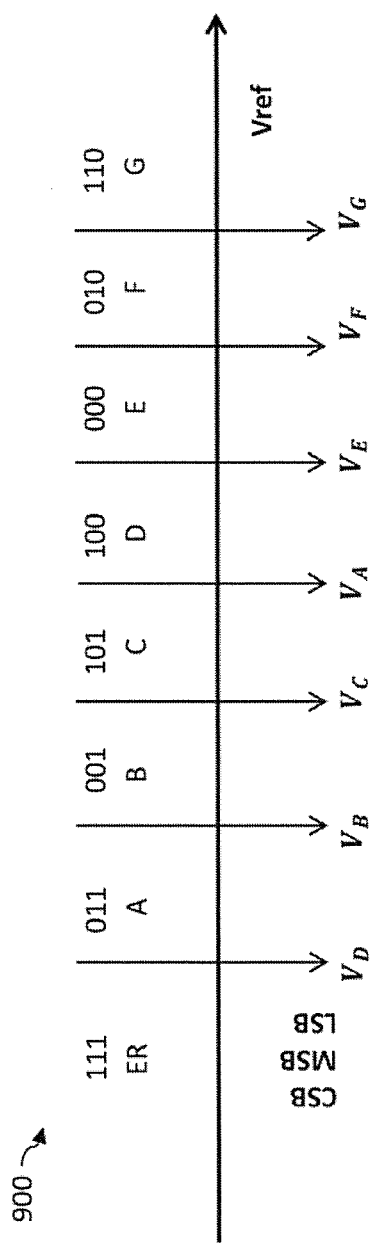

FIG. 9A illustrates an exemplary read threshold voltage assignment 900 for an exemplary 1/2/4 triple-level cell flash memory device, according to one embodiment of the disclosure. Generally, an exemplary 1/2/4 TLC flash memory device represents a least significant bit (LSB) using one read threshold voltage ($V_A$); a center significant bit (CSB) using four read threshold voltages ($V_C$, $V_D$, $V_E$ and $V_G$); and a most significant bit (MSB) using two read threshold voltages ($V_B$ and $V_F$). FIG. 9A illustrates the exemplary read threshold voltage assignment 900 for read threshold voltages $V_A$ through $V_G$, to create eight decision regions (Erase Region (ER) and Regions A through G), and the corresponding bit assignments in each region for the LSB, CSB and MSB bits.

Figure 9B:
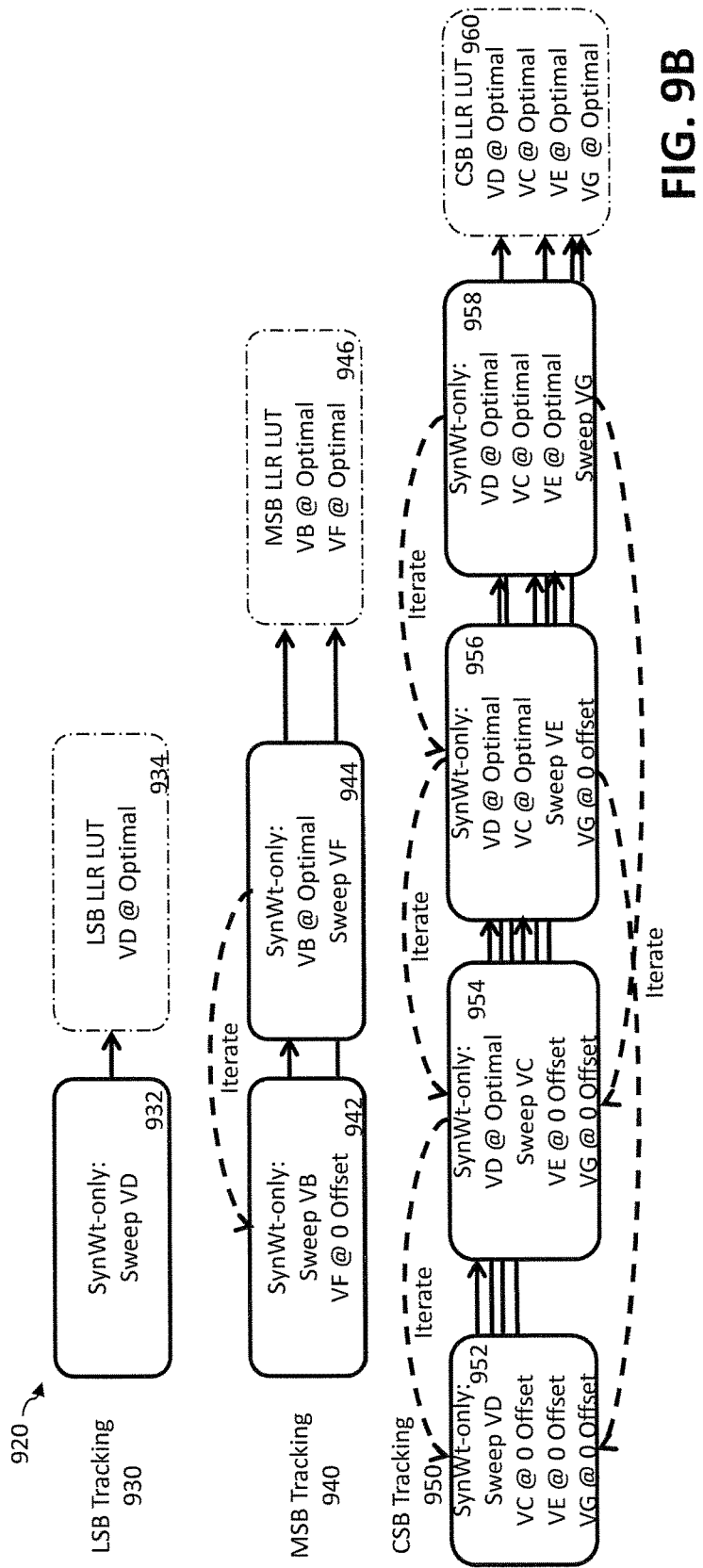

FIG. 9B illustrates an exemplary independent read threshold voltage tracking process 920 for the read threshold voltage assignment 900 of FIG. 9A, according to an embodiment of the disclosure. The exemplary independent read threshold voltage tracking process 920 recognizes, for example, that the two read threshold voltages ($V_B$ and $V_F$) for the MSB are dependent and must be tracked together, using the disclosed independent read threshold voltage tracking techniques (and likewise, the four read threshold voltages ($V_C$, $V_D$, $V_E$ and $V_G$) for the CSB and the one read threshold voltage ($V_A$) for the LSB.

As shown in FIG. 9B, in one or more embodiments, the exemplary independent read threshold voltage tracking process 920 performs LSB tracking 930 of the corresponding read threshold voltage ($V_A$) by sweeping read threshold voltage $V_A$ during step 932 to determine the $V_A$ offset with the substantially minimum syndrome weight value ($V_{Aopt}$). Then, the exemplary LSB tracking 930 optionally calculates the LLR lookup table 600 (FIG. 6) for the LSB page during step 934 using the determined substantially optimal offset for $V_A$ ($V_{Aopt}$), as discussed further below in conjunction with FIGS. 11 and 12.

The exemplary independent read threshold voltage tracking process 920 then performs MSB tracking 940 of the corresponding two read threshold voltages ($V_B$ and $V_F$) by sweeping read threshold voltage $V_B$ during step 942 to determine the $V_B$ offset with the substantially minimum syndrome weight value and holding read threshold voltages $V_F$ at a default value; and then sweeping read threshold voltages $V_F$ during step 944 to determine the $V_F$ offset with the substantially minimum syndrome weight value and holding read threshold voltage $V_B$ at the determined substantially optimal $V_B$ offset ($V_{Bopt}$). Then, the exemplary MSB tracking 940 optionally calculates the LLR lookup table 600 (FIG. 6) for the MSB page during step 946 using the determined substantially optimal offsets for $V_B$ and $V_F$ ($V_{Bopt}$ and $V_{Fopt}$), as discussed further below in conjunction with FIGS. 11 and 12.

The exemplary independent read threshold voltage tracking process 920 then performs CSB tracking 950 of the corresponding four read threshold voltages ($V_C$, $V_D$, $V_E$ and $V_G$) by sweeping read threshold voltage $V_D$ during step 952 to determine the $V_D$ offset with the substantially minimum syndrome weight value and holding read threshold voltages $V_C$, $V_E$ and $V_G$ at default values; sweeping read threshold voltages $V_C$ during step 954 to determine the $V_C$ offset with the substantially minimum syndrome weight value and holding read threshold voltage $V_D$ at the determined substantially optimal $V_D$ offset ($V_{Dopt}$) and $V_E$ and $V_G$ at a default value; sweeping read threshold voltage $V_E$ during step 956 to determine the $V_E$ offset with the substantially minimum syndrome weight value and holding read threshold voltages $V_D$ and $V_C$ at the determined substantially optimal offsets for $V_D$ and $V_C$ ($V_{Dopt}$ and $V_{Copt}$) and then sweeping read threshold voltage $V_G$ during step 958 to determine the $V_G$ offset with the substantially minimum syndrome weight value and holding read threshold voltages $V_D$, $V_C$, $V_E$ at the determined substantially optimal offsets for $V_D$, $V_C$ and $V_E$ ($V_{Dopt}$, $V_{Copt}$ and $V_{Eopt}$). Then, the exemplary CSB tracking 950 optionally calculates the lookup table 600 (FIG. 6) for the CSB page during step 960 using the determined substantially optimal offsets for $V_C$, $V_D$, $V_E$ and $V_G$ ($V_{Copt}$, $V_{Dopt}$, $V_{Eopt}$ and $V_{Gopt}$), as discussed further below in conjunction with FIGS. 11 and 12.

As shown in FIG. 9B, in one or more embodiments, the exemplary independent read threshold voltage tracking process 920 can optionally repeat (e.g., by iterating) the LSB tracking 930, MSB tracking 940 and CSB tracking 950 using the new substantially optimal read threshold voltages (e.g., ($V_{Aopt}$ through $V_{Gopt}$) until a desired bit error rate is obtained and/or the bit error rate does not improve for a predefined number of iterations, in a similar manner as FIG. 8B.

Figure 10A:

FIG. 10A illustrates an exemplary read threshold voltage assignment 1000 for an exemplary triple-level cell flash memory device that employs super pages where a codeword is written across all bytes from all page types, according to one embodiment of the disclosure. Since a codeword is written across all bytes from all page types, all of the read threshold voltages (e.g., (R(1) through R(7)) are dependent and, in some embodiments, must be optimized together using the disclosed independent read threshold voltage tracking techniques. FIG. 10A illustrates the exemplary read threshold voltage assignment 1000 for read threshold voltages R(1) through R(7), to create eight decision regions (Erase Region (ER) and Regions A through G), and the corresponding bit assignments in each region for the LSB, CSB and MSB bits.

Figure 10B:
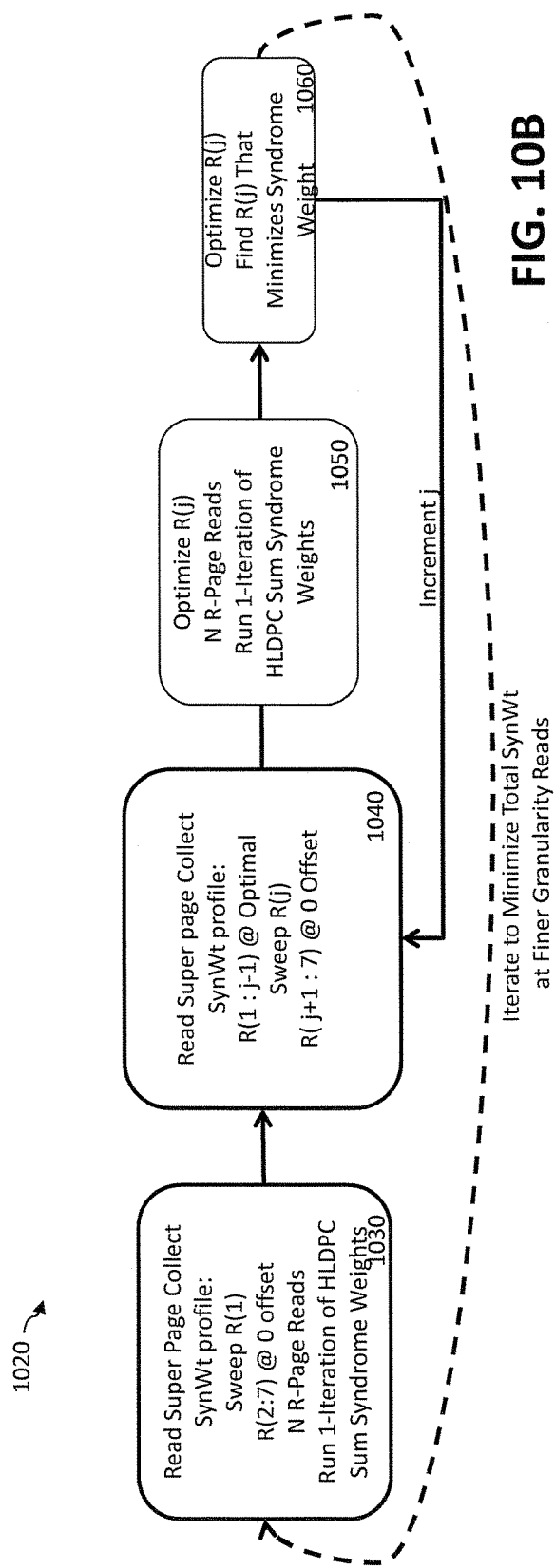

FIG. 10B illustrates an exemplary independent read threshold voltage tracking process 1020 for the read threshold voltage assignment 1000 of FIG. 10A, according to an embodiment of the disclosure. Generally, the exemplary independent read threshold voltage tracking process 1020 optimizes one read threshold voltage (e.g., R(1)) holds the other read threshold voltages (e.g., R(2) through R(7)) at default values, and then performs seven loops to optimize each subsequent read threshold voltage. Thereafter, the exemplary independent read threshold voltage tracking process 1020 can optionally iterate, in the manner described above, using the determined substantially optimum read threshold voltages.

As shown in FIG. 10B, the exemplary independent read threshold voltage tracking process 1020 initially reads a super page and collects a syndrome weight profile during step 1030, by sweeping the read threshold voltage R(1) and holding read threshold voltages R(2) through R(7) at default values. Assuming there are N possible offset options for read threshold voltage R(1), N reads are performed during the sweep. The read values are applied to the HLDPC decoder to obtain the syndrome weights for failed decoding attempts, and the syndrome weights are aggregated. The HLPDC is run such that a substantially minimum amount of operations are used to obtain the syndrome weight, or a dedicated syndrome weight calculator in hardware and/or software is used.

Thereafter, the exemplary independent read threshold voltage tracking process 1020 reads a super page and collects a syndrome weight profile during step 1040 in a loop for the remaining read threshold voltages, by sweeping the read threshold voltage R(j); holding read threshold voltages R(1) through R(j−1) at the determined substantially optimum read threshold voltages and holding read threshold voltages R(j+1) through R(7) at default values.

The read threshold voltage R(j) is optimized during step 1050 using N reads at the N possible offset options for read threshold voltage R(j). The read values are applied to the HLDPC decoder to obtain the syndrome weights for failed decoding attempts, and the syndrome weights are aggregated.

During step 1060, read threshold voltage R(j) is optimized by finding the value of Find R(j) that minimizes the syndrome weight. The counter j is then incremented and program control returns to step 1040 and continues in the manner described above until substantially optimum read threshold voltages are obtained for the other read threshold voltages R(j+1) through R(7).

As shown in FIG. 10B, in one or more embodiments, the exemplary independent read threshold voltage tracking process 1020 can optionally repeat (e.g., by iterating) the tracking of the read threshold voltages R(1) through R(7), to minimize the total syndrome weight at finer granularity reads until a desired bit error rate is obtained and/or the bit error rate does not improve for a predefined number of iterations, in a similar manner as FIG. 8B.

In one or more embodiments, the syndrome weights obtained using the tracking processes shown in FIG. 7 and in FIGS. 8B through 10B can be mapped to a bit error rate. Generally, the bit error rate can be estimated for the current read threshold voltage $V_i$ ($BER_s(V_i)$) from the syndrome weight of the given page $P_j$. A syndrome is an estimate of the number of bits in error, in a known manner. The syndrome weight can be obtained, for example, from a syndrome weight calculator or a hard decision decoder for a specified number of iterations. The bit error rate can be computed from the syndrome weight, as follows;

Syndrome=$Hx'$ where x is the read value, H is the parity check matrix of a binary LDPC code and ' indicates a transpose operation. The syndrome is a vector of ones and zeroes, and the syndrome weight is the number of ones in the syndrome vector. A number of techniques exist to translate a syndrome weight to a bit error rate. For example, a syndrome weight can be translated to a bit error rate, as follows:

Bit error rate estimate=Syndrome weight/average column weight of $H$ matrix.

Figure 11:
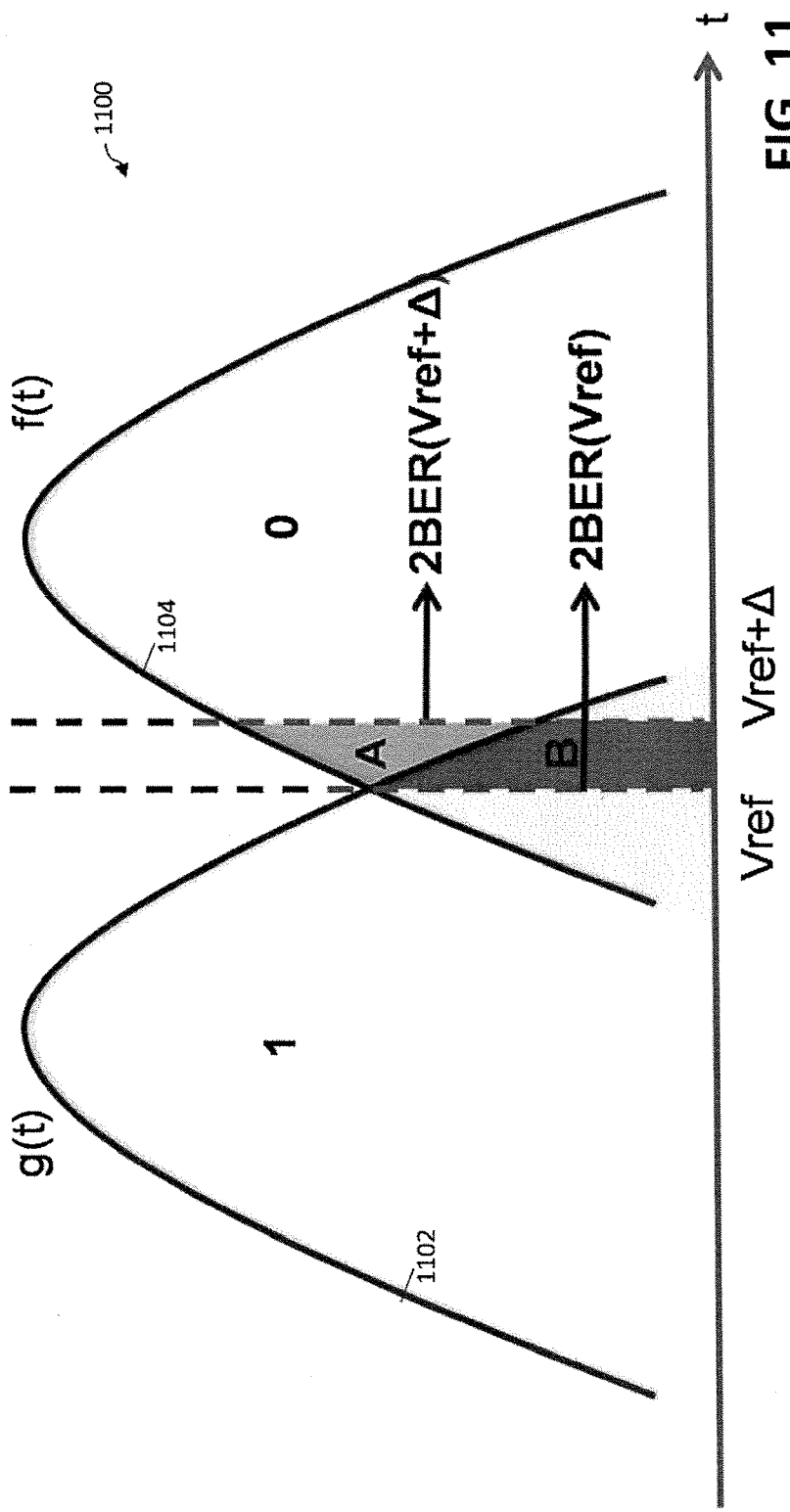
FIG. 11 is a chart of a voltage distribution of a memory cell, in accordance with certain embodiments of the present disclosure.

FIG. 11 is a graph 1100 of cell voltage distributions 1102, 1104, for a normal hard decision read in accordance with some embodiments of the present disclosure. The resulting voltages read from the memory cell thus appear something like the distributions 1102, 1104, shown in the graph 1100 of FIG. 11, rather than two distinct discrete voltage levels corresponding to the two states at the target state voltage level.

The BER profile obtained from the syndrome weights collected by one or more of the independent read threshold voltage tracking processes shown in FIG. 7 and in FIGS. 8B through 10B can be used to adaptively map a given cell location to a log likelihood ratio value. As shown in FIG. 11, the voltage distributions of an SLC cell intersect in unreliable regions A and B and it is difficult to estimate A and B directly as the distributions are not measured directly either. Instead, if a BER or syndrome weight profile is used, then A can be estimated as follows:

$A = 2BER(V_{ref} + \Delta) - 2BER(V_{ref}) \geq 0$, while B is estimated from the BER at the intersection point using $B = 2\alpha BER(V_{ref}) \geq 0$. The unknown, that needs to be pre-calculated is $\alpha$, where $0 \leq \alpha \leq 1$ and BER(X) denotes BER when X is used as a threshold. Based on the quantities A and B, LLR can be estimated (for example, during step 790 of the exemplary independent read threshold voltage tracking process 700) as follows:

$$A = 2BER(V_{ref} + \Delta) - 2BER(V_{ref}), B = 2\alpha BER(V_{ref})$$

$$LLR(V_{ref} + \Delta) = \log(B) - \log(A + B) =$$

$$\log\{\alpha BER(V_{ref})\} - \log\{BER(V_{ref} + \Delta) - (1 - \alpha)BER(V_{ref})\}$$

To match the LLR($V_{ref}+\Delta$) of value of "L" from a known look-up table to the decision region represented by A+B, this can be rearranged to give:

$$BER(V_{ref}+\Delta)=\{1+(e^L-1)\alpha\}BER(V_{ref})$$

The previous equation is for an SLC cell, and can easily be extended to an MLC or TLC cell, as would be apparent to a person of ordinary skill in the art, with the following assumptions: (i) the error probability ratio at each $V_{ref}$ offset location in a page is known, and (ii) only neighboring voltage states induce errors into each other. Then, for an MLC/TLC page, the SLC case can be generalized, as follows:

$$BER(V_{ref}+\Delta)=\{1+(e^L-1)\alpha\beta\}BER(V_{ref})$$

where $\beta$ is the error probability ratio at each $V_{ref}$ read window in a page. For example, if an MSB page has two $V_{refs}$ in its read window ($V_a$ and $V_b$), and its total error probability is $P_e$, $V_a$'s error probability is $0.6P_e$, and $V_b$ error probability is 0.4Pe, then $\beta$ is 0.6 for $V_a$ while it is 0.4 for $V_b$. If it is further assumed that errors occur at each $V_{ref}$ location in a page with equal probability, then, $$\beta = \frac{1}{\#V_{ref}},$$

and hence the only unknown would be $\alpha$. If $\alpha$ is characterized (e.g., offline or at another time), then $\Delta$ can be found be searching numerically for a solution to the relation:

$$BER(V_{ref}+\Delta) = \left\{1+\frac{(e^L-1)\alpha}{\#V_{ref}}\right\}BER(V_{ref}).$$

In one or more embodiments, offline or adaptive characterization (on-the-fly) can be used to find a based on retention or PEC values if the distributions can be estimated using reference written data. In that case, states 1 and 0 are distinguishable and the values can be measured, as follows:

$BER0(V_{ref}) \triangleq \tfrac{1}{2}\text{Prob}(\hat{x}=1|x=0, V_{ref})$, $BER1(V_{ref}) \triangleq \tfrac{1}{2}\text{Prob}(\hat{x}=0|x=1, V_{ref})$, $BER0(V_{ref}+\Delta) \triangleq \tfrac{1}{2}\text{Prob}(\hat{x}=1|x=0 V_{ref}+\Delta)$, and $BER1(V_{ref}+\Delta) \triangleq \tfrac{1}{2}\text{Prob}(\hat{x}=0|x=1, V_{ref}+\Delta)$, Then, $\alpha$ can be estimated using:

$\alpha=1-BER1(V_{ref}+\Delta)/BER1(V_{ref})$.

The techniques described in FIG. 11 for an SLC can be extended to a multi-level cell based on the present disclosure, as would be apparent to a person of ordinary skill in the art.

Figure 12:
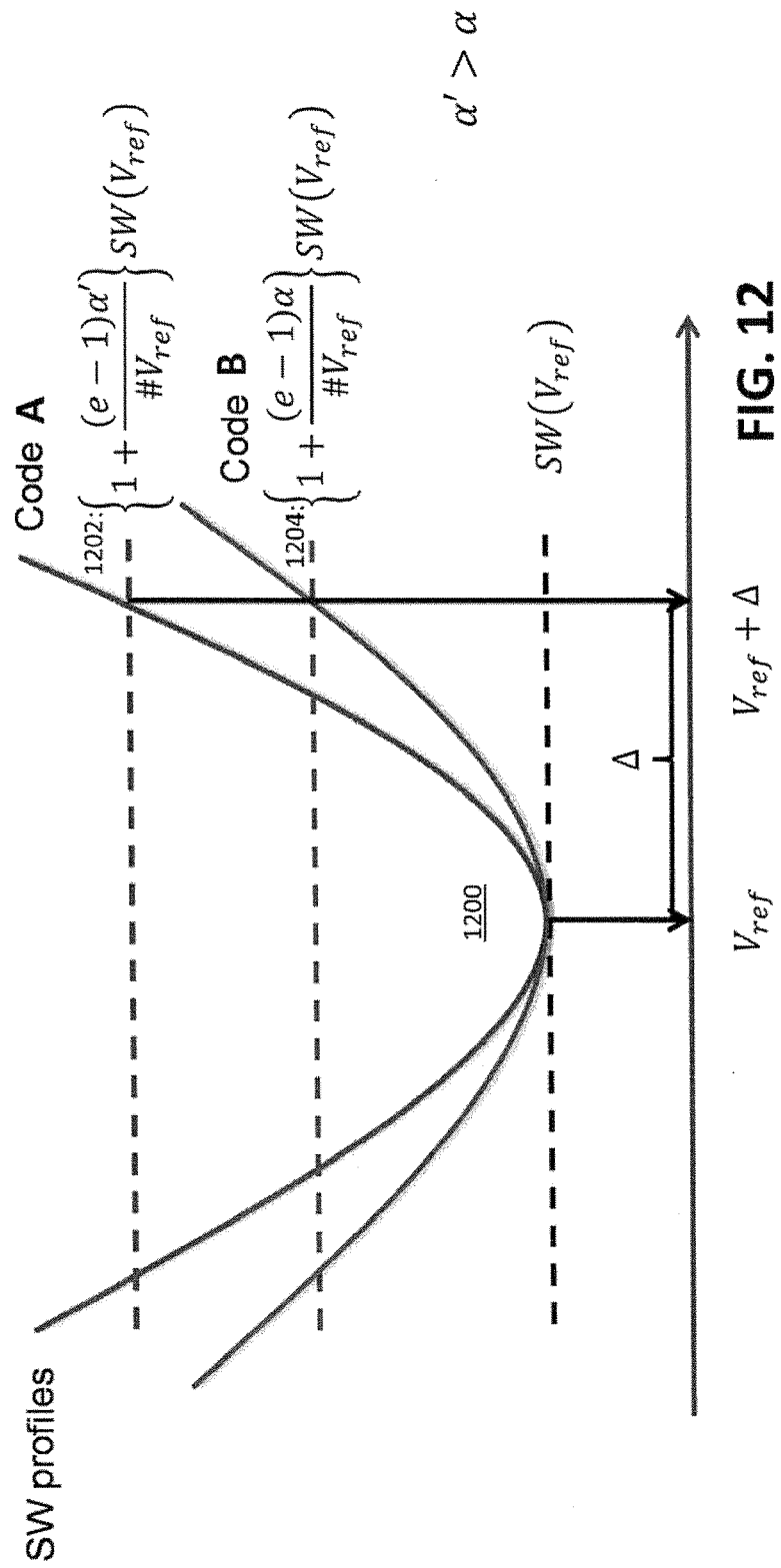
FIG. 12 is a chart of a syndrome weight tracking profile, in accordance with certain embodiments of the present disclosure.

FIG. 12 is a chart of a syndrome weight tracking profile 1200, in accordance with certain embodiments of the present disclosure. FIG. 12 shows that a can be computed from the syndrome weight profile 1200 using equations 1202, 1204, and a is also dependent on the LDPC code rate being used to find the syndrome weight profile 1200. If the code used has a higher code rate then a would be larger.

CONCLUSION

In one or more embodiments of the disclosure, independent read threshold voltage tracking profiling is performed to independently adjust dependent read threshold voltages for a memory to address variations in read threshold voltages as the solid state storage media evolves and or degrades. In one exemplary embodiment, a controller adjusts a plurality of dependent read threshold voltages for a memory by identifying a substantially optimum value for a first dependent read threshold voltage, while setting the other dependent read threshold voltage(s) to corresponding default values, and then separately identifying the substantially optimum value for each of the other dependent read threshold voltages.

It should be understood that the particular independent read threshold voltage tracking arrangements illustrated in FIGS. 1 through 12 are presented by way of illustrative example only, and should not be construed as limiting in any way. Numerous alternative configurations of system and device elements and associated processing operations can be used in other embodiments.

Illustrative embodiments disclosed herein can provide a number of significant advantages relative to conventional arrangements.

For example, one or more embodiments provide significantly improve adaptive voltage tracking techniques since the substantially optimum value for multiple read threshold voltages can be obtained with only linear complexity in the number of read operations.

It is to be appreciated that the particular advantages described above and elsewhere herein are associated with particular illustrative embodiments and need not be present in other embodiments. Also, the particular types of independent read threshold voltage tracking features and functionality as illustrated in the drawings and described above are exemplary only, and numerous other arrangements may be used in other embodiments.

As mentioned previously, at least portions of the disclosed independent read threshold voltage tracking system may be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

Some illustrative embodiments of a processing platform that may be used to implement at least a portion of an information processing system comprises cloud infrastructure including virtual machines. The cloud infrastructure further comprises sets of applications running on respective ones of the virtual machines. These and other types of cloud infrastructure can be used to provide what is also referred to herein as a multi-tenant environment. One or more system components such as controller 420 and/or encoder/decoder 430, or portions thereof, are illustratively implemented for use by tenants of such a multi-tenant environment.

The disclosed independent read threshold voltage tracking arrangements may be implemented using one or more processing platforms. One or more of the processing modules or other components may therefore each run on a computer, storage device or other processing platform element. A given such element may be viewed as an example of what is more generally referred to herein as a "processing device."

Figure 13:
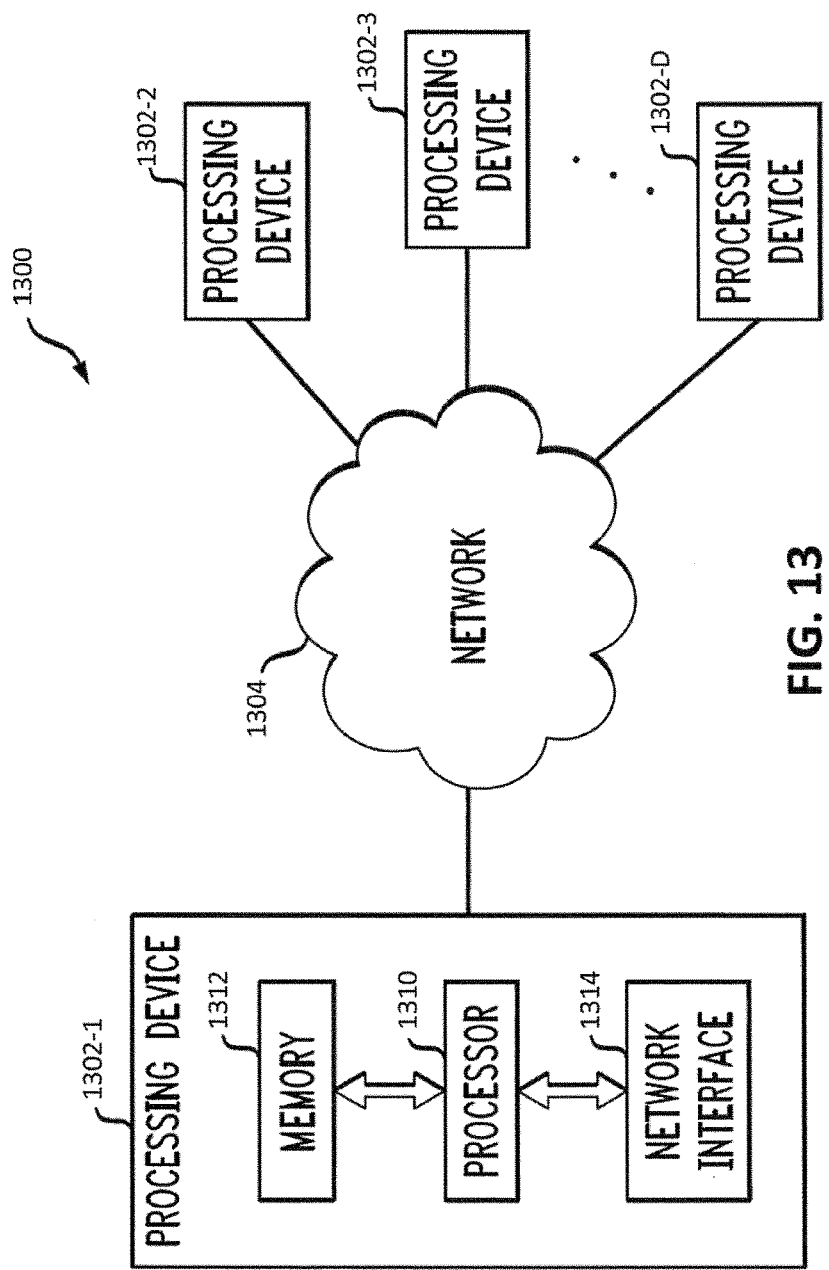
FIG. 13 illustrates a processing platform that may be used to implement at least a portion of one or more embodiments of the disclosure.

Referring now to FIG. 13, one possible processing platform that may be used to implement at least a portion of one or more embodiments of the disclosure is shown. The processing platform 1300 in this embodiment comprises at least a portion of the given system and includes at least one processing device(s), denoted 1302-1, 1302-2, 1302-3, . . . 1302-D, which communicate with one another over a network 1304. The network 1304 may comprise any type of network, such as the Internet, a wireless area network (WAN), a local area network (LAN), a satellite network, a telephone or cable network, a cellular network, a wireless network such as WiFi or WiMAX, or various portions or combinations of these and other types of networks.

The processing device 1302-1 in the processing platform 1300 comprises a processor 1310 coupled to a memory 1312. The processor 1310 may comprise a microprocessor, a microcontroller, an application specific integrated circuit (ASIC), a field programmable gate array (FPGA) or other type of processing circuitry, as well as portions or combinations of such circuitry elements. The memory 1312 may comprise random access memory (RAM), read only memory (ROM) or other types of memory, in any combination. The memory 1312 and other memories disclosed herein should be viewed as illustrative examples of what are more generally referred to as "processor-readable storage media" storing executable program code of one or more software programs.

Also included in the processing device 1302-1 is network interface circuitry 1314, which is used to interface the processing device with the network 1304 and other system components, and may comprise conventional transceivers.

The other processing devices 1302, if any, of the processing, platform 1300 are assumed to be configured in a manner similar to that shown for processing device 1302-1 in the figure.

Again, the particular processing platform 1300 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 13, or each such element may be implemented on a separate processing platform.

Articles of manufacture comprising such processor-readable storage media are considered illustrative embodiments. A given such article of manufacture may comprise, for example, a storage array, a storage disk or an integrated circuit containing RAM. ROM or other electronic memory, or any of a wide variety of other types of computer program products. The term "article of manufacture" as used herein should be understood to exclude transitory, propagating signals. Numerous other types of computer program products comprising processor-readable storage media can be used.

Again, the particular processing platform 1300 shown in FIG. 13 is presented by way of example only, and the independent read threshold voltage tracking system may include additional or alternative processing platforms, as well as numerous distinct processing platforms in any combination, with each such platform comprising one or more computers, servers, storage devices or other processing devices.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the independent read threshold voltage tracking techniques system. Such components can communicate with other elements of the independent read threshold voltage tracking system over any type of network or other communication media.

As indicated previously, components of an information processing system as disclosed herein can be implemented at least in part in the form of one or more software programs stored in memory and executed by a processor of a processing device. For example, at least portions of the functionality of the independent read threshold voltage tracking process 700 of FIG. 7 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems and independent read threshold voltage tracking systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:
1. A method, comprising:
reading one or more codewords of a plurality of pages using a plurality of different values of a first read threshold voltage and a default value of a second read threshold voltage, wherein the reading requires the first read threshold voltage and at least the second read threshold voltage to read a plurality of bits in the plurality of pages;
applying read values obtained from a memory for the plurality of pages for the plurality of values of the first read threshold voltage and the default value of the second read threshold voltage to a decoder;
aggregating a syndrome weight for each failed decoding attempt for the plurality of values of the first read threshold voltage;
identifying a reading using one of the plurality of values of the first read threshold voltage having a substantially minimum syndrome weight as a substantially optimum value for the first read threshold voltage;
reading the one or more codewords of the plurality of pages using the substantially optimum value of the first read threshold voltage and a plurality of different values of the second read threshold voltage;
applying the read values obtained from the memory for the substantially optimum value of the first read thresh- old voltage and the plurality of values of the second read threshold voltage to the decoder;

aggregating the syndrome weight for each failed decoding attempt for the plurality of values of the second read threshold voltage; and identifying a reading using one of the plurality of values of the second read threshold voltage having a substantially minimum syndrome weight as a substantially optimum value for the second read threshold voltage.

2. The method of claim 1, further comprising the step of repeating the step of reading the one or more codewords of the plurality of pages using the plurality of different values of the first read threshold voltage, starting with the substantially optimum value for the first read threshold voltage, and the substantially optimum value for the second read threshold voltage.

3. The method of claim 2, wherein the repeating continues until one or more of a desired bit error rate is obtained and bit error rate does not improve for a predefined number of iterations.

4. The method of claim 1, further comprising the steps of obtaining a bit error rate profile for a plurality of page populations based on one or more of the syndrome weights and decoded data and using the bit error rate profile to determine one or more likelihood values for the plurality of page populations.

5. The method of claim 4, wherein the bit error rate profiles for the plurality of page populations are used to dynamically select log likelihood ratio values for a failing page.

6. The method of claim 4, wherein the bit error rate profiles for the plurality of page populations are used to determine a read threshold voltage that gives a desired log likelihood ratio value.

7. The method of claim 1, wherein a plurality of voltage states is read as a single page and where the substantially optimum value for the first read threshold voltage is identified while setting other read threshold voltages to corresponding default values and then separately identifying the substantially optimum value for each of the other read threshold voltages.

8. The method of claim 1, wherein at least three of the read threshold voltages are dependent on one another and where the substantially optimum value for a first one of the dependent read threshold voltages is identified while setting the other dependent read threshold voltages to corresponding default values and then separately identifying the substantially optimum value for each of the other dependent read threshold voltages.

9. The method of claim 1, wherein the syndrome weights are obtained from one or more of a syndrome weight calculator and a hard decision decoder.

10. A tangible machine-readable recordable storage medium, wherein one or more software programs when executed by one or more processing devices implement the steps of the method of claim 1.

11. An apparatus, comprising:
a first memory; and
at least one processing device, coupled to the first memory, operative to implement the following steps:
reading one or more codewords of a plurality of pages using a plurality of different values of a first read threshold voltage and a default value of a second read threshold voltage, wherein the reading requires the first read threshold voltage and at least the second read threshold voltage to read a plurality of bits in the plurality of pages;

applying read values obtained from a second memory for the plurality of pages for the plurality of values of the first read threshold voltage and the default value of the second read threshold voltage to a decoder;

aggregating a syndrome weight for each failed decoding attempt for the plurality of values of the first read threshold voltage;

identifying a reading using one of the plurality of values of the first read threshold voltage having a substantially minimum syndrome weight as a substantially optimum value for the first read threshold voltage;

reading the one or more codewords of the plurality of pages using the substantially optimum value of the first read threshold voltage and a plurality of different values of the second read threshold voltage;

applying the read values obtained from the second memory for the substantially optimum value of the first read threshold voltage and the plurality of values of the second read threshold voltage to the decoder;

aggregating the syndrome weight decoder for each failed decoding attempt for the plurality of values of the second read threshold voltage; and identifying a reading using one of the plurality of values of the second read threshold voltage having a substantially minimum syndrome weight as a substantially optimum value for the second read threshold voltage.

12. The apparatus of claim 11, wherein the at least one processing device is further configured to repeat the step of reading the one or more codewords of the plurality of pages using the plurality of different values of the first read threshold voltage, starting with the substantially optimum value for the first read threshold voltage, and the substantially optimum value for the second read threshold voltage.

13. The apparatus of claim 11, wherein the at least one processing device is further configured to obtain a bit error rate profile for a plurality of page populations based on one or more of the syndrome weights and decoded data and use the bit error rate profile to determine one or more likelihood values for the plurality of page populations.

14. The apparatus of claim 11, wherein a plurality of voltage states is read as a single page and where the substantially optimum value for the first read threshold voltage is identified while setting other read threshold voltages to corresponding default values and then separately identifying the substantially optimum value for each of the other read threshold voltages.

15. The apparatus of claim 11, wherein at least three of the read threshold voltages are dependent on one another and where the substantially optimum value for a first one of the dependent read threshold voltages is identified while setting the other dependent read threshold voltages to corresponding default values and then separately identifying the substantially optimum value for each of the other dependent read threshold voltages.

16. A device comprising:
a controller configured to implement the following steps:
reading one or more codewords of a plurality of pages using a plurality of different values of a first read threshold voltage and a default value of a second read threshold voltage, wherein the reading requires the first read threshold voltage and at least the second read threshold voltage to read a plurality of bits in the plurality of pages;

applying read values obtained from a memory for the plurality of pages for the plurality of values of the first read threshold voltage and the default value of the second read threshold voltage to a decoder;

aggregating a syndrome weight for each failed decoding attempt for the plurality of values of the first read threshold voltage;

identifying a reading using one of the plurality of values of the first read threshold voltage having a substantially minimum syndrome weight as a substantially optimum value for the first read threshold voltage;

reading the one or more codewords of the plurality of pages using the substantially optimum value of the first read threshold voltage and a plurality of different values of the second read threshold voltage;

applying the read values obtained from the memory for the substantially optimum value of the first read threshold voltage and the plurality of values of the second read threshold voltage to the decoder;

aggregating the syndrome weight for each failed decoding attempt for the plurality of values of the second read threshold voltage; and identifying a reading using one of the plurality of values of the second read threshold voltage having a substantially minimum syndrome weight as a substantially optimum value for the second read threshold voltage.

17. The device of claim 16, wherein the controller is further configured to repeat the step of reading the one or more codewords of the plurality of pages using the plurality of different values of the first read threshold voltage, starting with the substantially optimum value for the first read threshold voltage, and the substantially optimum value for the second read threshold voltage.

18. The device of claim 16, wherein the controller is further configured to obtain a bit error rate profile for a plurality of page populations based on one or more of the syndrome weights and decoded data and use the bit error rate profile to determine one or more likelihood values for the plurality of page populations.

19. The device of claim 16, wherein a plurality of voltage states are read as a single page and where the substantially optimum value for the first read threshold voltage is identified while setting the other read threshold voltages to corresponding default values and then separately identifying the substantially optimum value for each of the other read threshold voltages.

20. The device of claim 16, wherein at least three of the read threshold voltages are dependent on one another and where the substantially optimum value for a first one of the dependent read threshold voltages is identified while setting the other dependent read threshold voltages to corresponding default values and then separately identifying the substantially optimum value for each of the other dependent read threshold voltages.

* * * * *